United States Patent
Bang et al.

(10) Patent No.: US 12,213,366 B2
(45) Date of Patent: Jan. 28, 2025

(54) DISPLAY DEVICE

(71) Applicant: Samsung Display Co., Ltd., Yongin-Si (KR)

(72) Inventors: Ki Ho Bang, Yongin-si (KR); Won Suk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 110 days.

(21) Appl. No.: 18/092,442

(22) Filed: Jan. 3, 2023

(65) Prior Publication Data

US 2023/0389389 A1   Nov. 30, 2023

(30) Foreign Application Priority Data

May 25, 2022   (KR) .......................... 10-2022-0064191

(51) Int. Cl.
| | |
|---|---|
| *H10K 59/40* | (2023.01) |
| *G06F 3/044* | (2006.01) |
| *H10K 59/121* | (2023.01) |
| *H10K 59/131* | (2023.01) |

(52) U.S. Cl.
CPC .......... *H10K 59/40* (2023.02); *G06F 3/0446* (2019.05); *H10K 59/1213* (2023.02); *H10K 59/131* (2023.02)

(58) Field of Classification Search
CPC .. H10K 59/40; H10K 59/1213; H10K 59/131; H10K 59/873; H10K 50/805; H10K 50/844; H10K 77/111; H10K 2102/311; G06F 3/0446; G06F 3/0412; G06F 2203/04112; G06F 3/041; G09G 3/3266

See application file for complete search history.

(56) References Cited

U.S. PATENT DOCUMENTS

| | | | |
|---|---|---|---|
| 11,456,348 B2 * | 9/2022 | Bang ................... | H10K 59/131 |
| 2018/0069191 A1* | 3/2018 | Lee .................. | H10K 59/80522 |
| 2018/0151662 A1* | 5/2018 | Rhe ....................... | H10K 59/40 |

(Continued)

*Primary Examiner* — Amy Onyekaba
(74) *Attorney, Agent, or Firm* — Innovation Counsel LLP

(57) ABSTRACT

A display device is disclosed. The display device comprises a substrate comprising a main region and a sub-region, the main region comprising a display area and a non-display area, the display area in which a plurality of sub-pixel areas configured to emit light for displaying an image are arranged, the non-display area disposed around the display area, and the sub-region protruding from one side of the main region and comprising a bending area which is deformed to be bent, a thin film transistor layer disposed on the substrate, a scan driver configured to output a scan signal to scan lines of the thin film transistor layer, a light emitting element layer disposed on the thin film transistor layer, a sensor electrode layer comprising a first sensor insulating layer and a second sensor insulating layer, control signal lines electrically connected to the scan driver and disposed in the non-display area and a first sub-region of the sub-region, control connection lines disposed in the bending area and electrically connected to the control signal lines through first control line contact holes, respectively, and a first hole protection layer disposed between the second sensor insulating layer and the control connection lines and corresponding to the first control line contact holes.

21 Claims, 24 Drawing Sheets

(56) References Cited

U.S. PATENT DOCUMENTS

| | | | | |
|---|---|---|---|---|
| 2018/0329552 A1* | 11/2018 | Song | ................... | G06F 3/04164 |
| 2019/0013373 A1* | 1/2019 | Lee | ...................... | H10K 59/131 |
| 2019/0057632 A1* | 2/2019 | Kim | ...................... | G09G 3/3266 |
| 2019/0096975 A1* | 3/2019 | Park | ...................... | H10K 59/873 |
| 2019/0164995 A1* | 5/2019 | Lee | ...................... | H10K 77/111 |
| 2019/0377445 A1* | 12/2019 | Jeong | .................. | G06F 3/04164 |
| 2020/0342791 A1* | 10/2020 | Song | ................ | G02F 1/133305 |
| 2021/0005696 A1* | 1/2021 | Bang | ................... | H10K 59/131 |
| 2021/0074799 A1* | 3/2021 | Kim | ...................... | H10K 59/131 |
| 2021/0193781 A1* | 6/2021 | Shim | ................... | H10K 59/1213 |
| 2021/0233474 A1* | 7/2021 | Lee | ...................... | H10K 59/131 |
| 2022/0100346 A1* | 3/2022 | Kim | ...................... | H10K 59/131 |
| 2022/0165823 A1* | 5/2022 | Ichikawa | ............... | H05B 33/06 |
| 2023/0292561 A1* | 9/2023 | Okabe | ................ | H10K 59/1201 |
| 2023/0337484 A1* | 10/2023 | Okabe | ....................... | G09F 9/30 |

* cited by examiner

DISPLAY DEVICE

CROSS-REFERENCE TO RELATED APPLICATION

This application claims priority from Korean Patent Application No. 10-2022-0064191 filed on May 25, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device and a light emitting display device. Examples of the light emitting display device include an organic light emitting display device including organic light emitting elements, an inorganic light emitting display device including inorganic light emitting elements such as inorganic semiconductors, and a micro light emitting display device including micro light emitting elements.

At least one surface of a flat panel display device may be a light emitting surface emitting light for image display. The light emitting surface may include a display area displaying an image and a non-display area disposed around the display area.

SUMMARY

However, as the number of sub-pixel areas disposed in the display area increases for high definition or scaling up, the number of components of the non-display area, such as integrated circuit chips and lines for supplying a signal or a power to the display area may increase. Accordingly, when the ratio of the non-display area in the light emitting surface increases, the width of the display area may be visually recognized to be smaller than an actual width.

In order to prevent this phenomenon, the non-display area may include a bending area for disposing at least a part of the non-display area on the rear surface of the display device. In this case, in order to reduce the possibility of occurrence of a disconnection defect of a line due to a bending stress in the bending area, insulating layers made of an inorganic material corresponding to the bending area may be removed.

Accordingly, the display device may include connection lines that connect lines of the non-display area to a signal pad or an integrated circuit chip and are arranged in the bending area. The connection lines may be respectively connected to the lines of the non-display area through a contact hole.

Since, however, insulating layers made of an organic material are stacked in the bending area, moisture generated by the insulating layers made of the organic material may flow into contact holes disposed at both ends of the connection lines. Accordingly, the insulating layers made of the organic material and disposed around the contact holes may be deformed, which may result in disconnection or poor connection defects of the line.

The present disclosure provides a display device capable of preventing moisture from flowing into the contact holes disposed at both ends of the connection lines of the bending area.

According to an embodiment, a display device comprises a substrate comprising a main region and a sub-region, the main region comprising a display area and a non-display area, the display area in which a plurality of sub-pixel areas configured to emit light for displaying an image are arranged, the non-display area disposed around the display area, and the sub-region protruding from one side of the main region and comprising a bending area which is deformed to be bent, a thin film transistor layer disposed in the display area on the substrate, a scan driver configured to output a scan signal to scan lines of the thin film transistor layer, a light emitting element layer disposed on the thin film transistor layer, a sensor electrode layer comprising a first sensor insulating layer and a second sensor insulating layer, the first sensor insulating layer disposed on an encapsulation layer which covers the light emitting element layer and the second sensor insulating layer covering sensor electrodes on the first sensor insulating layer, control signal lines electrically connected to the scan driver and disposed in the non-display area and a first sub-region of the sub-region which is connected to the non-display area, control connection lines disposed in the bending area and electrically connected to the control signal lines through first control line contact holes, respectively, and a first hole protection layer disposed between the second sensor insulating layer and the control connection lines and corresponding to the first control line contact holes.

The display device further comprises display pads and sensor pads electrically connected to a circuit board and disposed in a second sub-region of the sub-region which is connected to the bending area, and control pad lines disposed in the second sub-region and the control pad lines electrically connected between some of the display pads and the control connection lines, respectively. The control connection lines are respectively connected to the control pad lines through second control line contact holes. The first hole protection layer further corresponds to the second control line contact holes.

The first hole protection layer is formed on the same layer as the sensor electrodes.

The first hole protection layer completely overlaps the control connection lines.

The display device further comprises data fan-out lines disposed in the non-display area and the first sub-region and the data fan-out lines electrically connected to data lines of the thin film transistor layer, respectively, data connection lines disposed in the bending area and data connection lines electrically connected to the data fan-out lines through first data line contact holes, respectively, and a second hole protection layer disposed between the second sensor insulating layer and the data connection lines and corresponding to the first data line contact holes.

The display device further comprises a display driving circuit mounted in the second sub-region and configured to output a data signal of each of the plurality of sub-pixel areas, and data pad lines disposed in the second sub-region and data pad lines electrically connected between the display driving circuit and the data connection lines, respectively.

The data connection lines are electrically connected to the data pad lines through second data line contact holes, respectively. The second hole protection layer further corresponds to the second data line contact holes.

The first hole protection layer and the second hole protection layer are formed on the same layer as the sensor electrodes.

The first hole protection layer completely overlaps the control connection lines.

The display device further comprises a first power line configured to supply a first power to the plurality of sub-pixel areas, a second power line configured to supply a second power different from the first power to the plurality of sub-pixel areas, first power connection lines disposed in the bending area and connected to the first power line extending to the non-display area and the first sub-region, and second power connection lines disposed in the bending area and connected to the second power line extending to the non-display area and the first sub-region. The first power connection lines are connected to the first power line through first power line contact holes. The second power connection lines are connected to the second power line through second power line contact holes.

The display device further comprises a third hole protection layer disposed between the second sensor insulating layer and the first power connection lines and corresponding to the second power line contact holes.

The display device further comprises first power pad lines disposed in the second sub-region and first power pad lines electrically connected to the first power connection lines through third power line contact holes, respectively, and second power pad lines disposed in the second sub-region and second power pad lines electrically connected to the second power connection lines through fourth power line contact holes, respectively.

The third hole protection layer further corresponds to the fourth power line contact holes.

The third hole protection layer further corresponds to the first power line contact holes and the third power line contact holes.

The thin film transistor layer comprises a pixel driving unit corresponding to each of the plurality of sub-pixel areas. The light emitting element layer comprises a light emitting element corresponding to each of the plurality of sub-pixel areas. The pixel driving unit of each of the plurality of sub-pixel areas comprises a driving transistor disposed in series with the light emitting element between the first power line and the second power line, a first transistor turned on by the scan signal of the scan line and disposed between a gate electrode of the driving transistor and a second electrode of the driving transistor, a second transistor turned on by the scan signal of the scan line and disposed between the data line and the first electrode of the driving transistor, a third transistor disposed between a gate initialization voltage line supplying a first initialization voltage and the gate electrode of the driving transistor, a fourth transistor disposed between an emission initialization voltage line supplying a second initialization voltage and a first light emitting electrode of the light emitting element, a fifth transistor disposed between the first power line and the first electrode of the driving transistor, and a sixth transistor disposed between the second electrode of the driving transistor and the first light emitting electrode of the light emitting element. The fifth transistor and the sixth transistor are turned on by an emission gate signal of an emission control line.

The control signal lines comprise at least one scan output control line configured to respectively supply at least one scan timing control signal corresponding to an output timing of the scan signal, and two or more scan clock lines configured to supply two or more scan clock signals corresponding to generation of the scan signal, respectively.

The scan driver further outputs the emission gate signal to the emission control line. The control signal lines further comprise an emission output control line configured to supply at least one emission timing control signal corresponding to an output timing of the emission gate signal, and two or more emission clock lines configured to supply two or more emission clock signals corresponding to generation of the emission gate signal, respectively.

The display device further comprises constant voltage supply lines disposed in the non-display area and the first sub-region and the constant voltage supply lines configured to supply predetermined constant voltages to the plurality of sub-pixel areas or the scan driver, respectively, constant voltage supply connection lines disposed in the bending area and the constant voltage supply connection lines electrically connected to the constant voltage supply lines, respectively, and constant voltage supply pad lines disposed in the second sub-region and the constant voltage supply pad lines electrically connected to the constant voltage supply connection lines, respectively. The third hole protection layer further corresponds to contact holes between the constant voltage supply lines and the constant voltage supply connection lines, and contact holes between the constant voltage supply connection lines and the constant voltage supply pad lines.

The constant voltage supply lines comprise the gate initialization voltage line and the emission initialization voltage line.

The constant voltage supply lines comprise a first gate voltage line configured to supply a first gate voltage of a first voltage level to the scan driver, and a second gate voltage line configured to supply a second gate voltage having a second voltage level different from the first voltage level to the scan driver.

The sensor electrodes of the sensor electrode layer are disposed in a touch sensor area corresponding to at least the display area. The sensor electrode layer further comprises sensor lines disposed in a touch peripheral area that is a periphery of the touch sensor area and the sensor lines electrically connected to some of the sensor electrodes, respectively, the some of the sensor electrodes which are connected side by side in one direction. The sensor lines extend to the first sub-region and the sensor lines are electrically connected to sensor connection lines disposed in the bending area, respectively. The sensor connection lines are electrically connected to the sensor pads through sensor pad lines disposed in the second sub-region, respectively. The first hole protection layer is formed on the same layer as the sensor lines and the sensor pad lines, and is spaced apart from the sensor lines and the sensor pad lines.

The second sensor insulating layer is made of a negative photoresist material.

The display device according to embodiments includes control signal lines disposed in the non-display area and a first sub-region and connected to a scan driver, control connection lines disposed in the bending area and respectively connected to the control signal lines through first control line contact holes, and a first hole protection layer disposed between a second sensor insulating layer and the control connection lines and corresponding to the first control line contact holes.

That is, the first hole protection layer blocks the gap between the first control line contact holes and the second sensor insulating layer.

Accordingly, moisture generated by the second sensor insulating layer that is susceptible to moisture permeation is blocked by the first hole protection layer, and thus is unlikely to reach the first control line contact holes. Therefore, it is possible to prevent the organic layers disposed around the first control line contact holes from being deformed in response to moisture, thereby preventing a defect in which the control signal lines and the control connection lines are disconnected or not connected.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
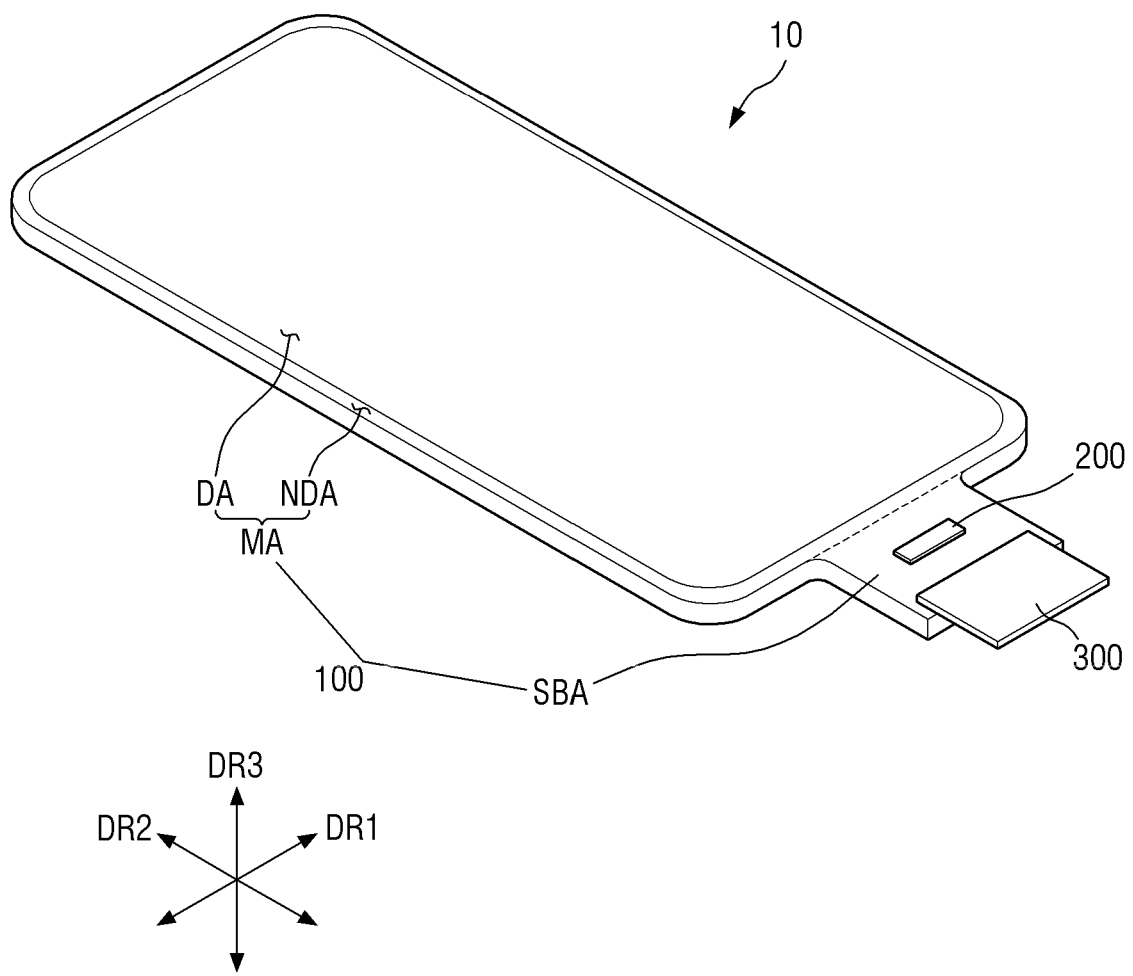
FIG. 1 is a perspective view illustrating a display device according to one embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having,"

"includes" or "including" are used, they may specify the presence of stated features, integers, steps, operations, elements or components, but do not preclude the presence or addition of other features, integers, steps, operations, elements, components, or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a perspective view illustrating a display device according to one embodiment.

Referring to FIG. 1, a display device 10 is a device for displaying a moving image or a still image. The display device 10 may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 10 is an organic light emitting display device, but the present disclosure is not limited thereto.

The display device 10 includes a display panel 100, a display driving circuit 200, and a circuit board 300.

The display panel 100 may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display panel 100 is not limited to the rectangular shape, and may be formed in another polygonal shape, a circular shape or an elliptical shape. The display panel 100 may be formed to be flat, but is not limited thereto. For example, the display panel 100 may include a curved portion formed at left and right ends and having a predetermined curvature or a varying curvature. In addition, the display panel 100 may be formed flexibly so that it can be curved, bent, folded, or rolled.

The display panel 100 may include a substrate SUB (see FIG. 4) including a main region MA and a sub-region SBA.

The main region MA may include a display area DA displaying an image and a non-display area NDA that is a peripheral area of the display area DA. The display area DA may include sub-pixels SPX (see FIG. 5) displaying an image. The sub-region SBA may protrude from one side of the main region MA in the second direction DR2.

FIG. 1 illustrates a state in which the sub-region SBA is unfolded to be disposed side by side with the main region MA.

Figure 3:
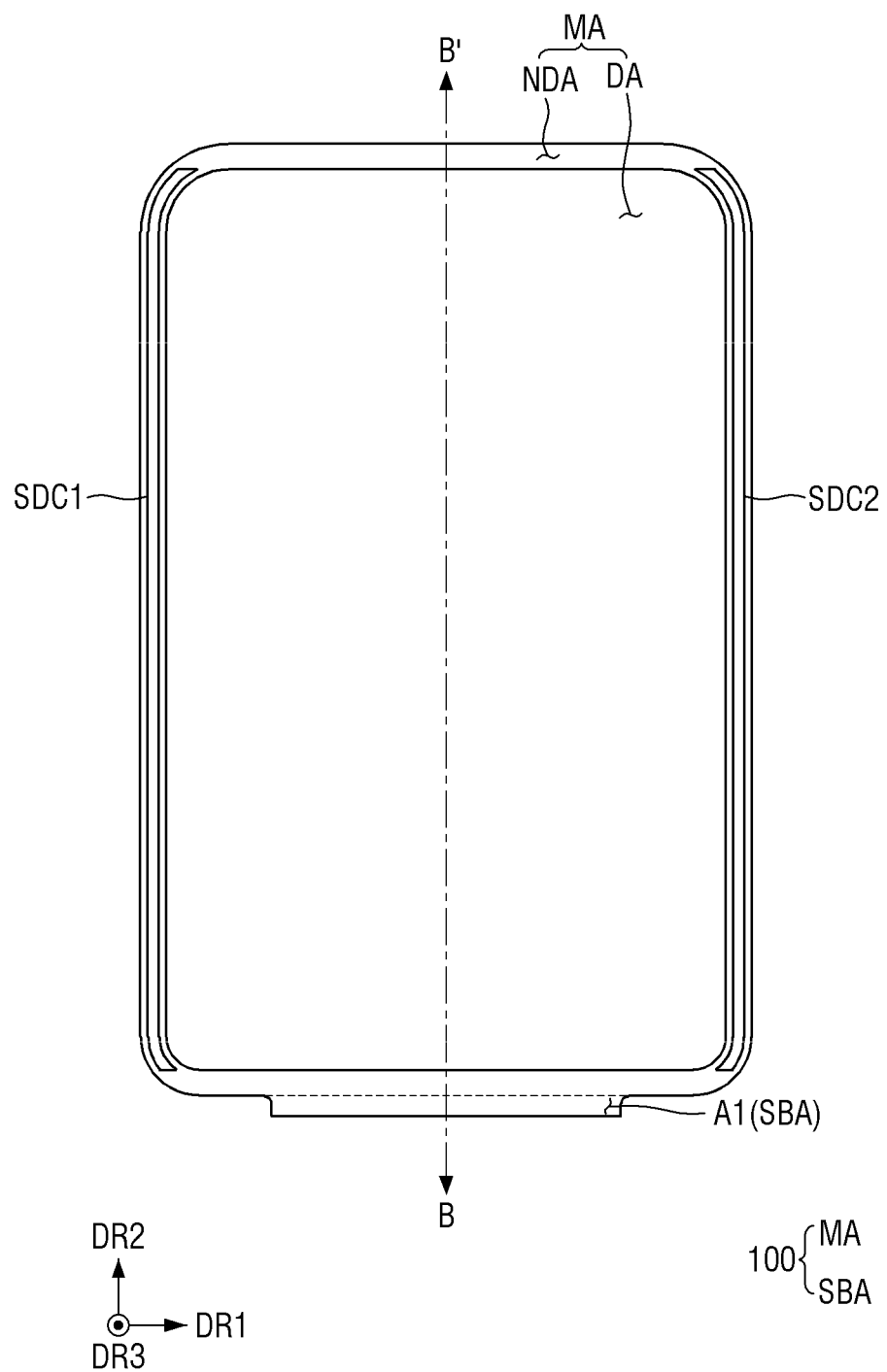

However, as illustrated in FIG. 3, a part of the sub-region SBA may be bent so that the other remaining part of the sub-region SBA may be disposed on the bottom surface of the display panel 100. In this case, it may overlap the main region MA in a thickness direction DR3 of the substrate SUB. The display driving circuit 200 may be arranged in the sub-region SBA.

As illustrated in FIG. 1, the display driving circuit 200 may generate signals and voltages for driving the display panel 100. The display driving circuit 200 may be formed as an integrated circuit (IC) and attached onto the display panel 100 by a chip on glass (COG) method, a chip on plastic (COP) method, or an ultrasonic bonding method, but the present disclosure is not limited thereto. For example, the display driving circuit 200 may be attached onto the circuit board 300 by a chip on film (COF) method.

The circuit board 300 may be attached to one end of the sub-region SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

Figure 2:
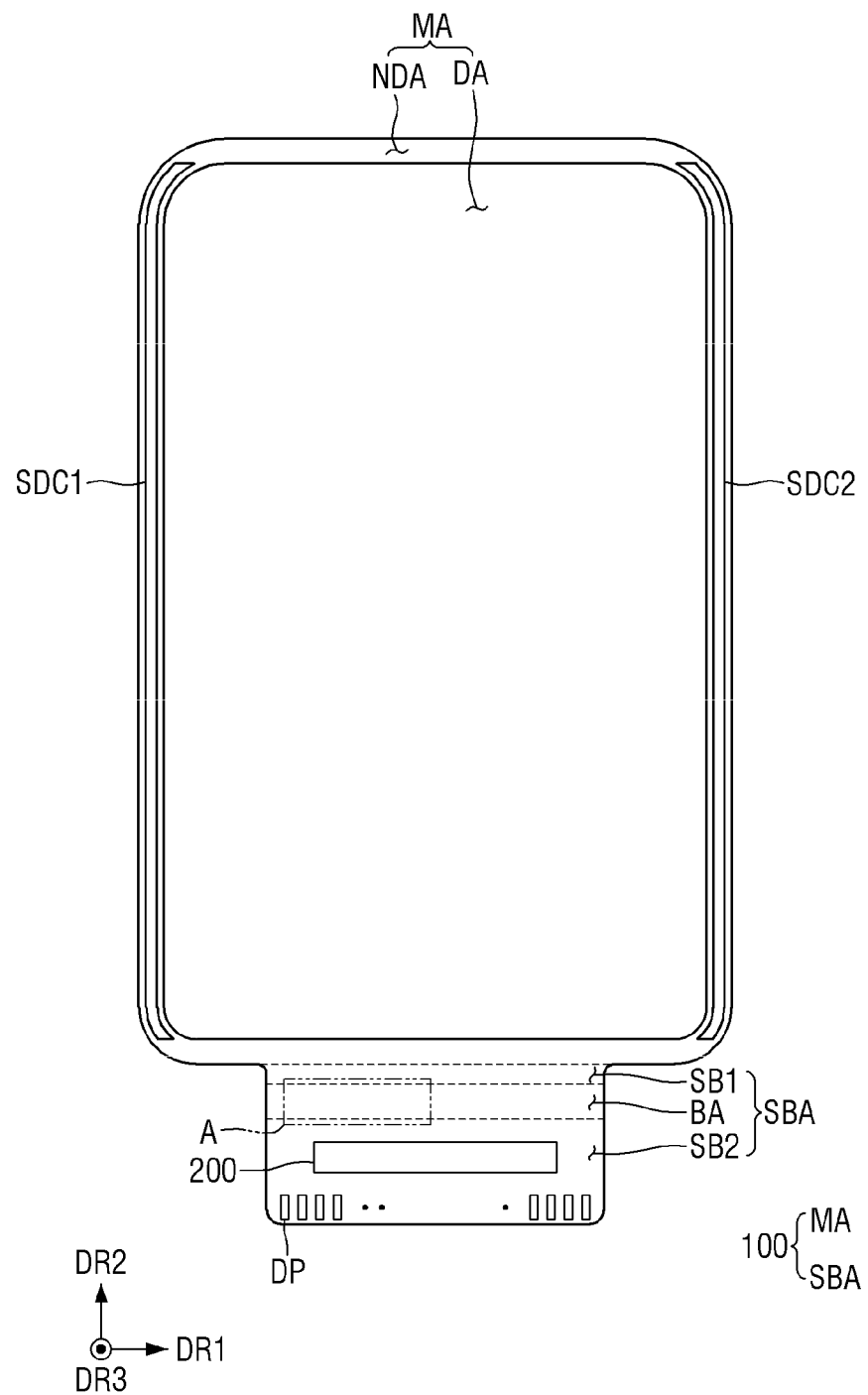
FIGS. 2 and 3 are plan views illustrating a display device according to one embodiment.
Figure 4:
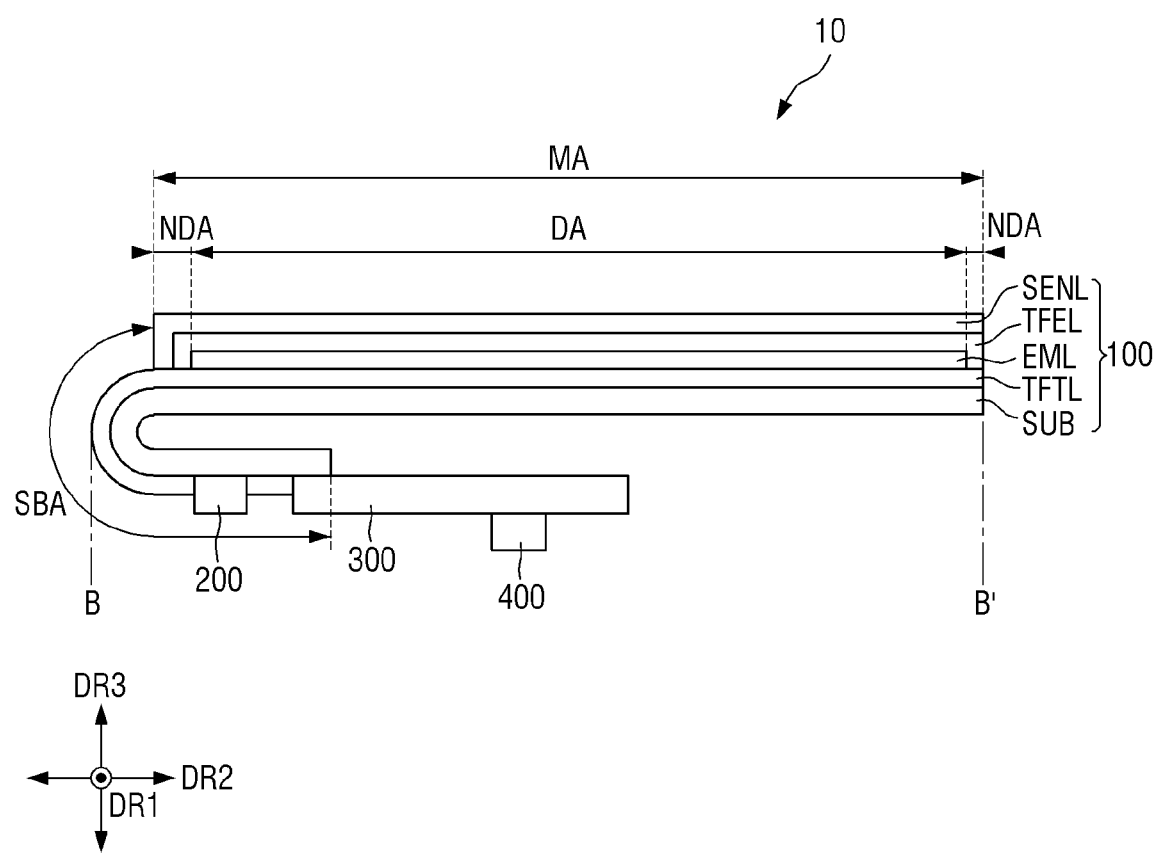
FIG. 4 is a cross-sectional view showing an example of a plane taken along line B-B' of FIG. 3.

FIGS. 2 and 3 are plan views illustrating a display device according to one embodiment. FIG. 4 is a cross-sectional view showing an example of a plane taken along line B-B' of FIG. 3.

It is exemplarily shown in FIG. 2 that the sub-region SBA is unfolded without being bent. It is exemplarily shown in FIGS. 3 and 4 that the sub-region SBA is bent.

Referring to FIGS. 2 to 4, the display panel 100 may include the main region MA and the sub-region SBA.

The main region MA may include a display area DA displaying an image and a non-display area NDA that is a peripheral area of the display area DA. The display area DA may occupy most of the main region MA. The display area DA may be disposed at the center of the main region MA.

The non-display area NDA may be disposed adjacent to the display area DA. The non-display area NDA may be an area outside the display area DA. The non-display area NDA may be disposed to surround the display area DA. The non-display area NDA may be an edge area of the display panel 100.

A first scan driver SDC1 and a second scan driver SDC2 may be disposed in the non-display area NDA. The first scan driver SDC1 may be disposed side by side with one side (e.g., the left side) of the display area DA in the first direction DR1, and the second scan driver SDC2 may be disposed side by side with the other side (e.g., the right side) of the display area DA in the first direction DR1, but the present disclosure is not limited thereto. Each of the first scan driver SDC1 and the second scan driver SDC2 may receive a control signal from the display driving circuit 200 through control signal lines CSL (see FIG. 5), and may generate a scan signal and an emission gate signal in response to the control signal.

The scan signal may be outputted to a scan line SCL (see FIG. 6) of the display area DA. The emission gate signal may be outputted to an emission control line ECL (see FIG. 6) of the display area DA.

The sub-region SBA may protrude from one side of the main region MA in the second direction DR2. The length of the sub-region SBA in the second direction DR2 may be less than the length of the main region MA in the second direction DR2. The length of the sub-region SBA in the first direction DR1 may be substantially equal to or less than the length of the main region MA in the first direction DR1.

The sub-region SBA may include a bent portion and another portion disposed on the bottom surface of the display panel 100. In this case, the another portion of the sub-region SBA may overlap the main region MA in the third direction DR3.

The sub-region SBA may include a first sub-region SB1, a second sub-region SB2, and a bending area BA.

The first sub-region SB1 is a region protruding from one side of the main region MA in the second direction DR2. One side of the first sub-region SB1 may be in contact with the non-display area NDA of the main region MA, and the other side of the first sub-region SB1 may be in contact with the bending area BA.

The second sub-region SB2 is a region in which pads PD and the display driving circuit 200 are arranged. The display driving circuit 200 may be attached to driving pads of the second sub-region SB2 using a low-resistance high-reliability material such as self-assembly anisotropic conductive paste (SAP) or an anisotropic conductive film. The circuit board 300 may be attached to the pads PD of the second sub-region SB2 using a low-resistance high-reliability material such as SAP or an anisotropic conductive film. One side of the second sub-region SB2 may be in contact with the bending area BA.

As shown in FIG. 3, the bending area BA is bent. When the bending area BA is bent, the second sub-region SB2 may be disposed under the first sub-region SB1 and under the main region MA. The bending area BA may be disposed between the first sub-region SB1 and the second sub-region SB2. One side of the bending area BA may be in contact with the first sub-region SB1, and the other side of the bending area BA may be in contact with the second sub-region SB2.

As shown in FIG. 4, the display panel 100 may include a thin film transistor layer TFTL, a light emitting element layer EML, an encapsulation layer TFEL, and a sensor electrode layer SENL.

The substrate SUB may be formed of an insulating material such as polymer resin. For example, the substrate SUB may be formed of polyimide. The substrate SUB may be a flexible substrate which can be bent, folded or rolled.

The thin film transistor layer TFTL may be disposed on the substrate SUB. The thin film transistor layer TFTL may be arranged in the main region MA and the sub-region SBA. The thin film transistor layer TFTL includes thin film transistors.

The light emitting element layer EML may be disposed on the thin film transistor layer TFTL. The light emitting element layer EML may be arranged in the display area DA of the main region MA. The light emitting element layer EML includes light emitting elements arranged in light emitting units.

The encapsulation layer TFEL may be disposed on the light emitting element layer EML. The encapsulation layer TFEL may be arranged in the display area DA and the non-display area NDA of the main region MA. The encapsulation layer TFEL includes at least one inorganic layer and at least one organic layer for encapsulating the light emitting element layer.

The sensor electrode layer SENL may be disposed on the encapsulation layer TFEL. The sensor electrode layer SENL may be disposed in the main region MA. The sensor electrode layer SENL may sense a touch of a person or an object using touch electrodes.

A cover window (not shown) for protecting the upper portion of the display panel 100 may be disposed on the sensor electrode layer SENL. The cover window may be attached to the sensor electrode layer SENL by a transparent adhesive member such as an optically clear adhesive (OCA) film or an optically clear resin (OCR). The cover window may be made of an inorganic material such as glass, or an organic material such as plastic or a polymer material.

Further, an anti-reflection member (not shown) may be further disposed between the sensor electrode layer SENL and the cover window to prevent a decrease in visibility of the image displayed by the display panel 100 due to reflection of external light by the display panel 100. The anti-reflection member may be a polarizing film or a color filter.

A touch driving circuit 400 may be disposed on the circuit board 300. The touch driving circuit 400 may be formed as an integrated circuit (IC) and attached to the circuit board 300.

The touch driving circuit 400 may be electrically connected to a plurality of driving electrodes and a plurality of sensing electrodes of the sensor electrode layer SENL. The touch driving circuit 400 applies a touch driving signal to the plurality of driving electrodes, and senses a touch sensing signal of each of the plurality of touch nodes, for example, a charge change amount of mutual capacitance through the plurality of sensing electrodes.

The touch driving circuit 400 may determine whether the user's touch occurs, whether the user is proximate, and the like, according to the touch sensing signals of each of the plurality of touch nodes. The user's touch indicates direct contact of an object such as a user's finger or a pen with the front surface of the display device 10. The proximity of the user indicates that an object such as a user's finger or a pen is positioned away from the front surface of the display device 10, such as hovering.

Figure 5:
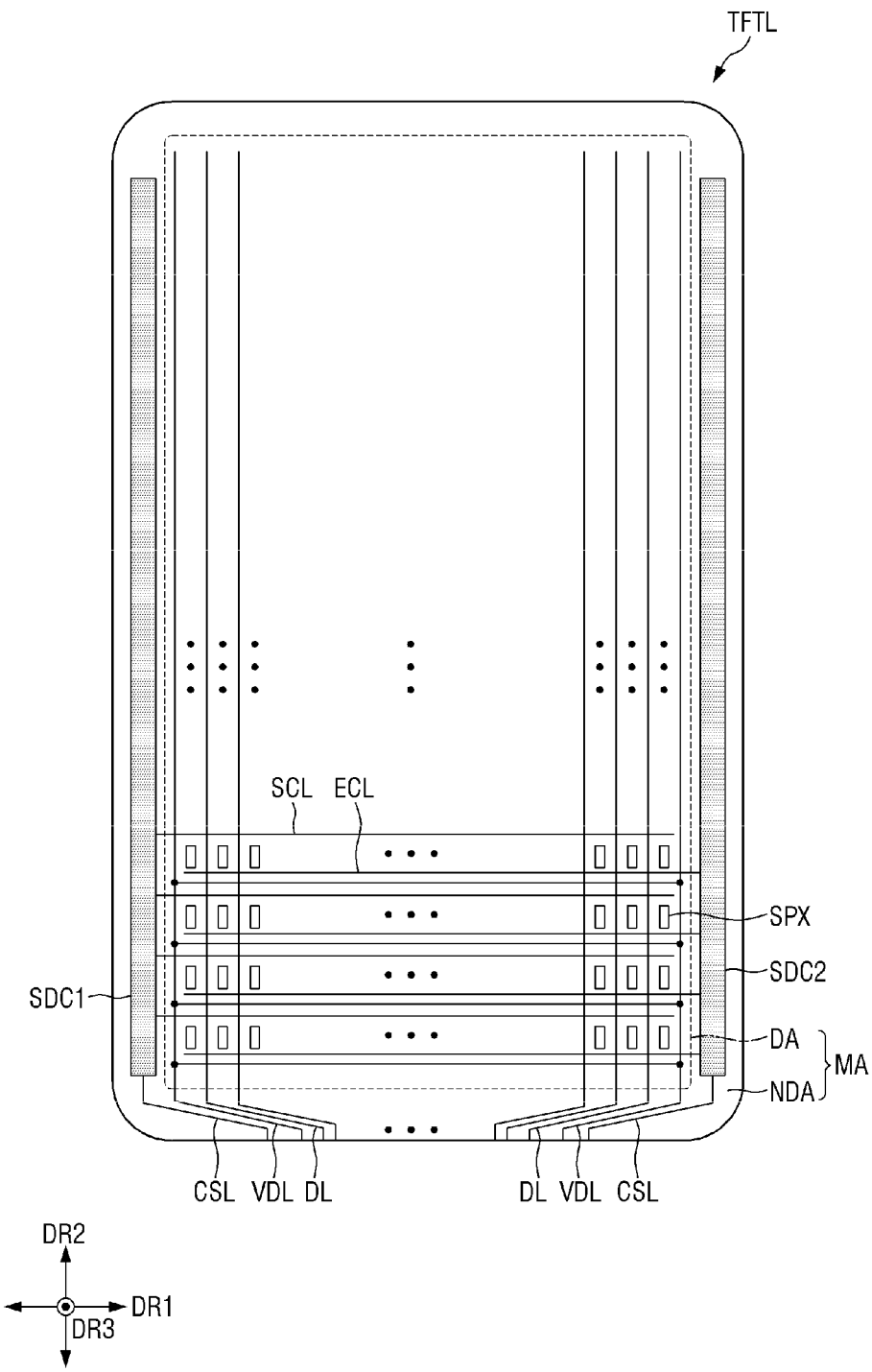
FIG. 5 is a layout diagram showing an example of the thin film transistor layer of FIG. 4.

FIG. 5 is a layout diagram showing an example of the thin film transistor layer of FIG. 4.

Referring to FIG. 5, the display panel 100 may include a plurality of sub-pixel areas SPX arranged in the first direction DR1 and the second direction DR2 in the display area DA.

The thin film transistor layer TFTL of the display panel 100 may include the scan line SCL, the emission control line ECL, a data line DL, and a first power line VDL disposed in the display area DA.

The scan line SCL may extend in the first direction DR1.

The scan line SCL may supply a scan signal corresponding to whether or not data is written to the plurality of sub-pixel areas SPX.

The first scan driver SDC1 and the second scan driver SDC2 may output the scan signal corresponding to whether or not data is written to the scan lines SCL of the display area DA in response to control signals of the control signal lines SCL.

For example, the first scan driver SDC1 and the second scan driver SDC2 may sequentially output the scan signal to the scan lines SCL of the display area DA during one frame period for image display in response to the control signals.

The control signals of the control signal lines SCL connected to the first scan driver SDC1 and the second scan driver SDC2 may include a scan timing control signal corresponding to the output timing of the scan signal, and two or more scan clock signals corresponding to the generation of the scan signal.

The emission control line ECL may extend in the first direction DR1.

The emission control line ECL may be disposed on the same layer as the scan line SCL and may be spaced apart from the scan line SCL. The emission control line ECL may supply the emission gate signal corresponding to whether or not light emission is started to the plurality of sub-pixel areas SPX.

Although not shown in detail in FIG. 5, the display panel 100 may further include an emission gate driver (not shown) for outputting the emission gate signal to the emission control line ECL.

The emission gate driver may be provided separately from the first scan driver SDC1 and the second scan driver SDC2. In this case, it may be disposed side by side with the first scan driver SDC1 or the second scan driver SDC2 in the non-display area NDA adjacent to at least one side of the display area DA in the first direction DR1.

Alternatively, the emission gate driver may be implemented as a part of at least one of the first scan driver SDC1 and the second scan driver SDC2. That is, at least one of the first scan driver SDC1 and the second scan driver SDC2 may include a circuit for outputting the emission gate signal.

In this case, the control signals of the control signal lines SCL connected to the first scan driver SDC1 and the second scan driver SDC2 may further include at least one emission timing control signal corresponding to the output timing of the emission gate signal, and two or more emission clock signals corresponding to the generation of the emission gate signal.

This is merely an example, and the device for outputting the emission gate signal according to one embodiment is not limited to the above-described one.

The data line DL may extend in the second direction DR2 and may supply the data signal outputted from the display driving circuit 200 to each of the plurality of sub-pixel areas SPX.

The display driving circuit 200 may apply the data signal of each of the plurality of sub-pixel areas SPX to the data lines DL of the display area DA based on digital video data and timing signals transmitted from the circuit board 300.

Further, the display driving circuit 200 may supply a scan control signal to the first scan driver SDC1 and the second scan driver SDC2 based on the digital video data and the timing signals.

The first power line VDL may supply a first power for driving a light emitting element to the plurality of sub-pixel areas SPX. The first power line VDL may receive the first power from the display driving circuit 200 or the circuit board 300.

Figure 6:
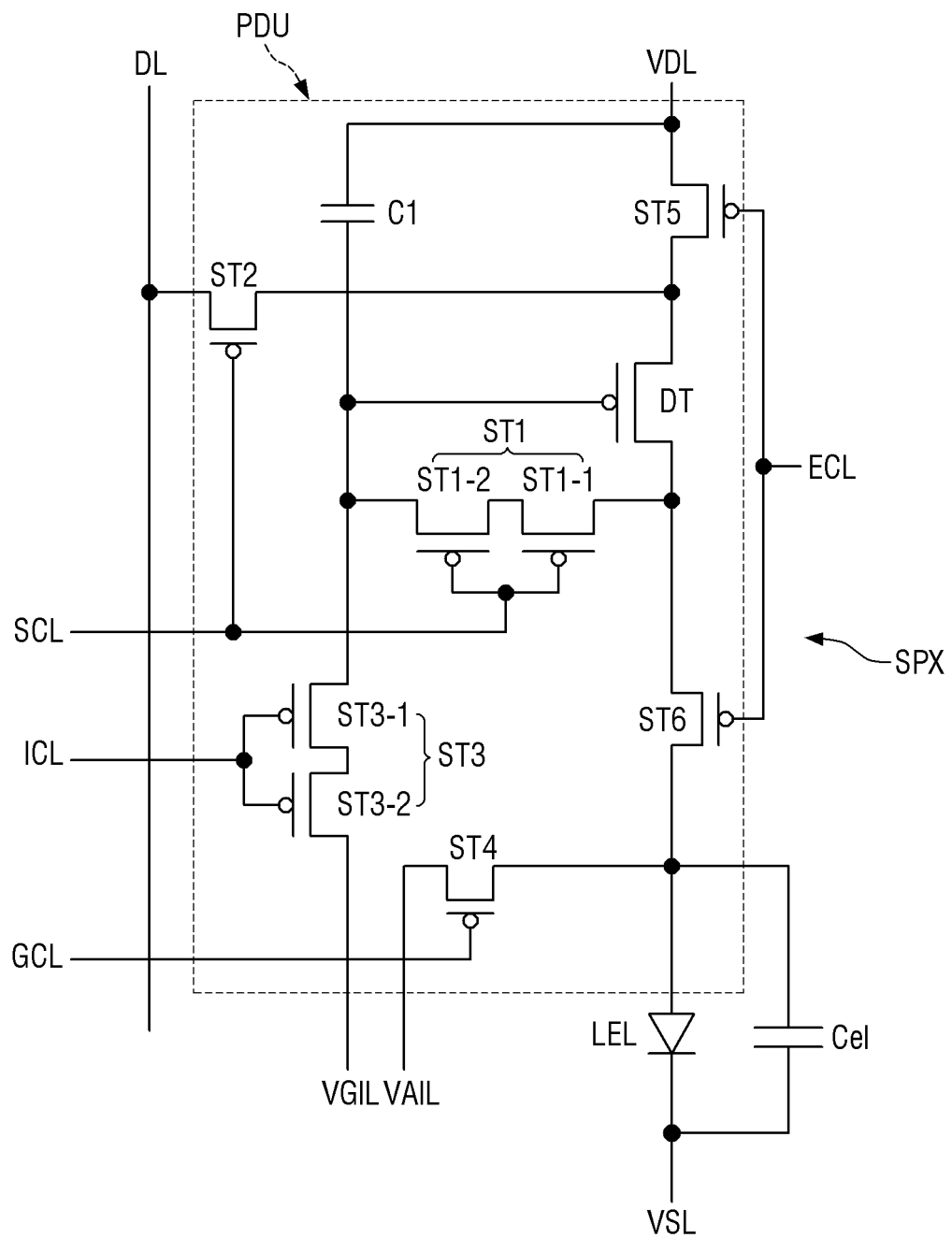
FIG. 6 is a circuit diagram showing an example of any one sub-pixel area in the display area of FIG. 5.

FIG. 6 is a circuit diagram showing an example of any one sub-pixel area in the display area of FIG. 5.

Referring to FIG. 6, each of the plurality of sub-pixel areas SPX may include a light emitting element LEL and a pixel driving unit PDU that supplies a driving current to the light emitting element LEL.

The light emitting element LEL may include an anode electrode, a cathode electrode, and a light emitting layer disposed between the anode electrode and the cathode electrode.

For example, the light emitting element LEL may be an organic light emitting diode having a light emitting layer made of an organic light emitting material. Alternatively, the light emitting element LEL may be an inorganic light emitting element including a light emitting layer made of an inorganic semiconductor. Alternatively, the light emitting element LEL may be a quantum dot light emitting element having a quantum dot light emitting layer. Alternatively, the light emitting element LEL may be a micro light emitting diode.

The pixel driving unit PDU may include a driving transistor DT, at least one switch element, and at least one capacitor. For example, the pixel driving unit PDU may include switch elements of a first transistor (switch transistor) ST1, a second transistor ST2, a third transistor ST3, a fourth transistor ST4, a fifth transistor ST5, and a sixth transistor ST6.

The driving transistor DT may include a gate electrode, a first electrode, and a second electrode, and may be connected in series with the light emitting element LEL between the first power line VDL and the second power line VDL.

When the scan signal of the scan line SCL and the data signal of the data line DL are supplied to the pixel driving unit PDU, the driving transistor DT generates a current between the first electrode and the second electrode, i.e., a drain-source current Ids, based on the data signal.

The drain-source current of the driving transistor DT is supplied as a driving current of the light emitting element LEL.

The light emitting element LEL emits light having a luminance corresponding to the driving current of the driving transistor DT.

A capacitor Ce1 connected in parallel with the light emitting element LEL is a parasitic capacitance between the anode electrode and the cathode electrode.

A capacitor C1 is connected between the first power line VDL and the gate electrode of the driving transistor DT.

A first transistor ST1 is connected between the second electrode of the driving transistor DT and the gate electrode of the driving transistor DT, and is turned on based on the scan signal supplied through the scan line SCL.

A second transistor ST2 is connected between the data line DL and the first electrode of the driving transistor DT, and is turned on based on the scan signal supplied through the scan line SCL.

Accordingly, when the scan signal is supplied through the scan line SCL, the first transistor ST1 and the second transistor ST2 are turned on.

At this time, the data signal of the data line DL is supplied to the first electrode of the driving transistor DT through the turned-on second transistor ST2.

In addition, the gate electrode and the second electrode of the driving transistor DT have the same potential through the turned-on first transistor ST1.

Accordingly, when the potential difference between the first electrode and the gate electrode of the driving transistor DT exceeds a threshold voltage, the drain-source current is generated between the first electrode and the second electrode of the driving transistor DT. The supply of the drain-source current by the driving transistor DT may be maintained based on the voltage charged in the capacitor C1.

The third transistor ST3 is connected between a gate initialization voltage line VGIL and the gate electrode of the driving transistor DT, and is turned on based on the initialization control signal of an initialization control line ICL.

When the third transistor ST3 is turned on, the potential of the gate electrode of the driving transistor DT is initialized to the first initialization voltage by a gate initialization voltage line VGIL.

The fourth transistor ST4 is connected between an emission initialization voltage line VAIL and the anode electrode of the light emitting element LEL, and is turned on based on the gate control signal of a gate control line GCL.

When the fourth transistor ST4 is turned on, the potential of the anode electrode of the light emitting element LEL is initialized to the second initialization voltage by the emission initialization voltage line VAIL.

The fifth transistor ST5 is connected between the first power line VDL and the first electrode of the driving transistor DT.

The sixth transistor ST6 is connected between the second electrode of the driving transistor DT and the anode electrode of the light emitting element LEL.

The fifth transistor ST5 and the sixth transistor ST6 are turned on based on the emission control signal of an emission control line ECL.

When the fifth transistor ST5 and the sixth transistor ST6 are turned on, the driving current by the driving transistor DT is supplied to the light emitting element LEL, and the light emitting element LEL emits light based on the driving current.

As illustrated in FIG. 6, all of the driving transistor DT, the first transistor ST1, the second transistor ST2, the third transistor ST3, the fourth transistor ST4, the fifth transistor ST5, and the sixth transistor ST6 that are included in the pixel driving unit PDU may be provided as P-type MOSFETs. In this case, each of the scan signal of the scan line SCL, the initialization control signal of the initialization control line ICL, the gate control signal of the gate control line GCL, and the emission control signal of the emission control line ECL may be a gate low level signal for turning on the P-type MOSFET.

Alternatively, unlike illustration of FIG. 6, some of the switching elements included in the pixel driving unit PDU may be provided as the P-type MOSFET, and the other remaining portion may be provided as the N-type MOSFET. In this way, the switching elements provided with the P-type MOSFET and the switching elements provided with the N-type MOSFET may include active layers of different semiconductor materials. Accordingly, the floor area ratio of the pixel area PX may be improved through the stacked structure, and it may be advantageous in improving resolution.

For example, although not separately illustrated, according to another example, the driving transistor DT, the second transistor ST2, the fourth transistor ST4, the fifth transistor ST5, and the sixth transistor ST6 among the switch elements of the pixel driving unit PDU may be provided as the P-type MOSFET having an active layer of polysilicon semiconductor material, and the first transistor ST1 and the third transistor ST3 may be provided with the N-type MOSFET having an active layer of an oxide semiconductor material.

In this case, since the first transistor ST1 is not turned on with the same signal as the signal for the second transistor ST2, the gate electrode of the first transistor ST1 may be connected to the gate control line GCL instead of the scan line SCL. In this way, the fourth transistor ST4 may be turned on when the gate control line GCL supplies a gate low level signal, and the first transistor ST1 may be turned on when the gate control line GCL supplies a gate high level signal. In addition, the third transistor ST may be turned on when the initialization control line ICL supplies a gate high level signal.

Figure 7:
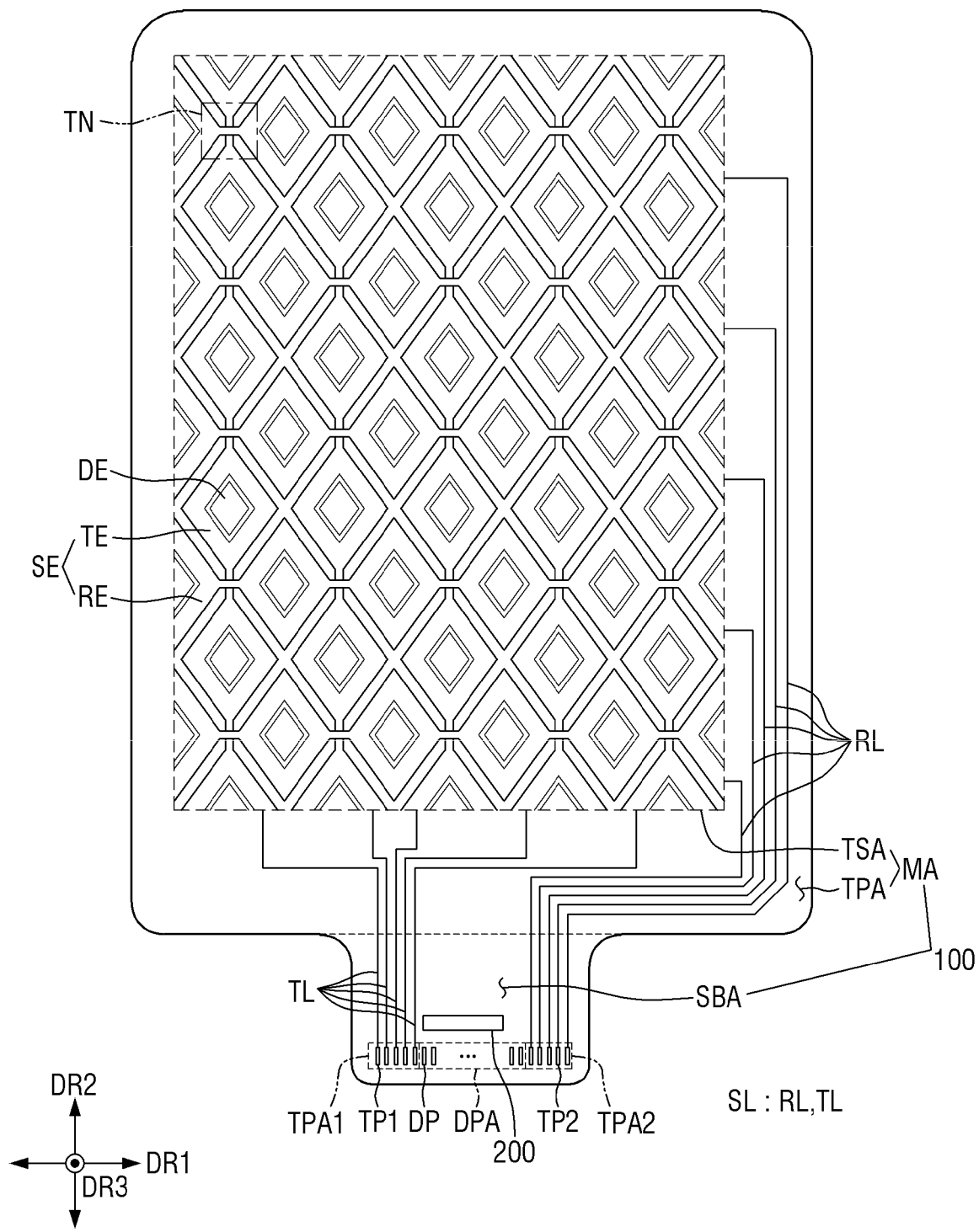
FIG. 7 is a layout diagram showing in detail an example of the sensor electrode layer of FIG. 4.
Figure 8:
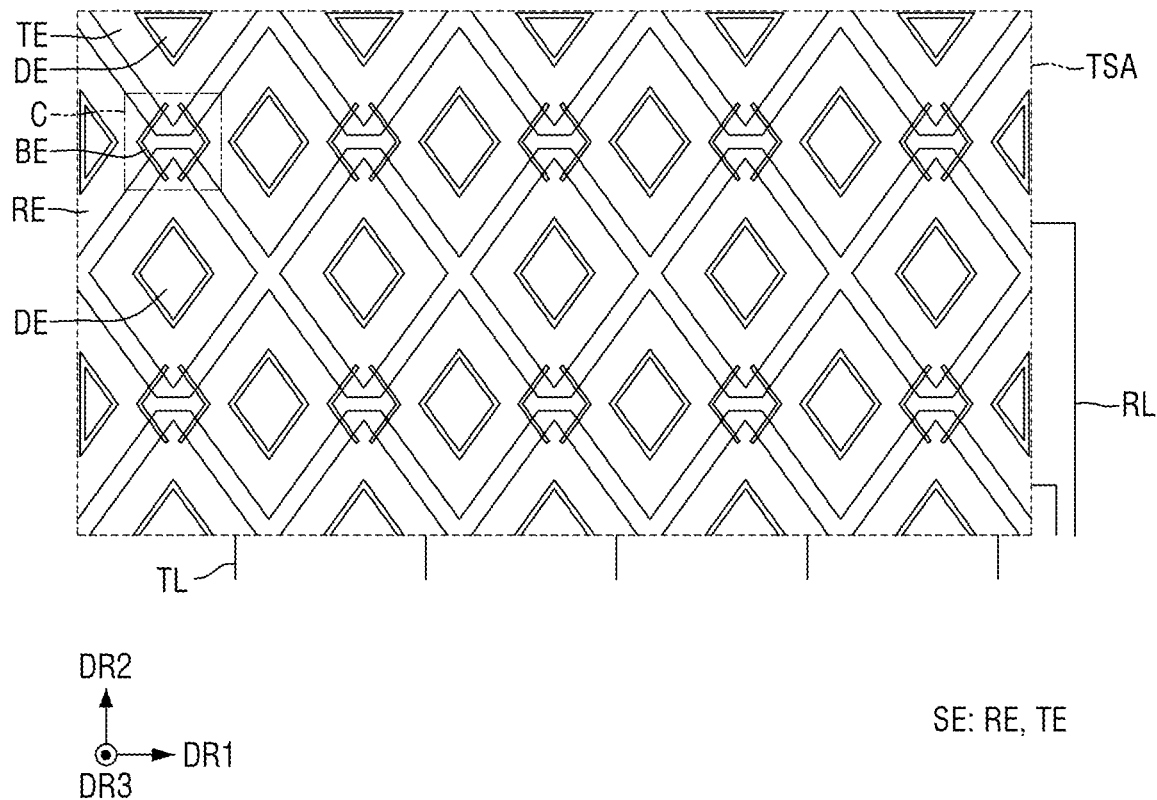
FIG. 8 is a layout diagram showing in detail a part of the touch sensing area of FIG. 7.

FIG. 7 is a layout diagram showing in detail an example of the sensor electrode layer of FIG. 4. FIG. 8 is a layout diagram showing in detail a part of the touch sensing area of FIG. 7.

Although FIGS. 7 and 8 illustrate that the sensor electrode layer SENL includes two types of sensor electrodes SE, i.e., driving electrodes TE and sensing electrodes RE, and is driven in a mutual capacitance manner in which a voltage charged in a mutual capacitance is sensed through the sensing electrodes RE in a state where a driving signal is applied to the driving electrodes TE, the present disclosure is not limited thereto.

FIGS. 7 and 8 illustrate only the sensor electrodes TE and RE, dummy patterns DE, sensor lines SL, and sensor pads TP1 and TP2.

Referring to FIG. 7, the sensor electrode layer SENL includes a touch sensor area TSA for sensing a user's touch and a touch peripheral area TPA disposed around the touch sensor area TSA. For example, the touch sensor area TSA may overlap the display area DA, and the touch peripheral area TPA may overlap the non-display area NDA.

The sensor electrode layer SENL may include the sensor electrodes SE and the dummy patterns DE disposed in the touch sensor area TSA.

The sensor electrodes SE may be electrodes that generate a mutual capacitance to sense a touch of an object or a person.

The sensor electrodes SE may include the driving electrodes TE and the sensing electrodes RE. The sensing electrode RE may be defined as a first sensor electrode, and the driving electrode TE may be defined as a second sensor electrode. Alternatively, the driving electrode TE may be defined as a first sensor electrode, and the sensing electrode RE may be defined as a second sensor electrode.

The sensing electrodes RE may be arranged side by side in the first direction DR1 and the second direction DR2. The sensing electrodes RE may be electrically connected in the first direction DR1. The sensing electrodes RE adjacent in the first direction DR1 may be connected to each other. The sensing electrodes RE adjacent in the second direction DR2 may be electrically separated from each other.

The driving electrodes TE may be arranged side by side in the first direction DR1 and the second direction DR2. The driving electrode TE adjacent in the first direction DR1 may be electrically separated from each other. The driving electrodes TE may be electrically connected in the second direction DR2. The driving electrodes TE adjacent in the second direction DR2 may be connected to each other through a bridge line BE of FIG. 8.

Referring to FIG. 8, the bridge line BE may be bent at least once. Although FIG. 8 illustrates that the bridge line BE has an angle bracket shape ("<" or ">"), the planar shape of the bridge line BE is not limited thereto. Since the driving electrodes TE adjacent to each other in the second direction DR2 are connected by the plurality of bridge lines BE, even if any one of the bridge lines BE is disconnected, the driving electrodes TE adjacent to each other in the second direction DR2 may be stably connected to each other. Although FIG. 8 illustrates that the adjacent driving electrodes TE are connected by two bridge lines BE, the number of the bridge lines BE between the adjacent driving electrodes TE is not limited thereto.

Since the driving electrodes TE and the sensing electrodes RE are spaced apart from each other, they are electrically separated at the intersections thereof. Accordingly, the mutual capacitance may be generated between the driving electrodes TE and the sensing electrodes RE.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be spaced apart from the driving electrode TE or the sensing electrode RE. Each of the dummy patterns DE may be electrically floating.

The length of the driving electrode TE in the first direction DR1 and the length of the driving electrode TE in the second direction DR2 may be approximately 3 mm to 5 mm. The length of the driving electrode TE in the first direction DR1 indicates the distance from the left end to the right end of the driving electrode TE. The length of the driving electrode TE in the second direction DR2 indicates the distance from the upper end to the lower end of the driving electrode TE. The length of the sensing electrode RE in the first direction DR1 and the length of the sensing electrode RE in the second direction DR2 may also be approximately 3 mm to 5 mm.

Although FIGS. 7 and 8 illustrate that each of the driving electrodes TE, the sensing electrodes RE, and the dummy patterns DE has a rhombus planar shape, the present disclosure is not limited thereto. For example, each of the driving electrodes TE, the sensing electrodes RE, and the dummy patterns DE may have a quadrilateral shape other than a rhombus shape, a polygonal shape other than a quadrilateral shape, a circular shape, or an elliptical shape in plan view.

Referring to FIG. 7, the sensor lines SL may be disposed in the sensor peripheral area TPA. The sensor lines SL may include sensing lines RL connected to the sensing electrodes RE, and driving lines TL connected to the driving electrodes TE. The sensing line RL may be defined as a first sensor line, and the driving line TL may be defined as a second sensor line.

The sensing electrodes RE arranged at one side of the touch sensor area TSA may be connected one-to-one to the sensing lines RL. For example, as shown in FIG. 7, the sensing electrode RE disposed at a right end among the sensing electrodes RE electrically connected in the first direction DR1 may be connected to the sensing line RL. The sensing lines RL may be connected one-to-one to the second sensor pads TP2. Therefore, the touch driving circuit 400 may be electrically connected to the sensing electrodes RE.

The driving electrodes TE arranged at one side of the touch sensor area TSA may be connected one-to-one to the driving lines TL. For example, as shown in FIG. 3, the driving electrode TE disposed at a lower end among the driving electrodes TE electrically connected in the second direction DR2 may be connected to the driving line TL.

The driving lines TL may be connected one-to-one to the first sensor pads TP1. Therefore, the touch driving circuit 400 may be electrically connected to the driving electrodes TE.

Since the driving electrodes TE are connected to the driving lines TL at both sides of the touch sensor area TSA and receive the touch driving signals, it is possible to prevent the difference between the touch driving signal applied to the driving electrodes TE arranged on the lower side of the touch sensor area TSA and the touch driving signal applied to the driving electrodes TE arranged on the upper side of the touch sensor area TSA due to the RC delay of the touch driving signal.

The first sensor pad area TPA1 in which the first sensor pads TP1 are arranged may be disposed at one side of the display pad area DPA in which the display pads DP are arranged in the second sub-region SB2 of the sub-region SBA.

The second sensor pad area TPA2 in which the second sensor pads TP2 are arranged may be disposed at the other side of the display pad area DPA in the second sub-region SB2 of the sub-region SBA.

Some of the display pads DP may be connected to the display driving circuit 200 mounted in the second sub-region SB2 of the sub-region SBA, and the first scan driver SDC1 and the second scan driver SDC2 disposed in the non-display area NDA. Further, some others of the display pads DP may be connected to lines for supplying a power to the display area DA.

The circuit board 300 (see FIG. 1) may be disposed on the display pads DP, the first sensor pads TP1, and the second sensor pads TP2. The display pads DP, the first sensor pads TP1, and the second sensor pads TP2 may be electrically connected to the circuit board 300 using a low-resistance high-reliability material such as SAP or an anisotropic conductive film. Therefore, the first sensor pads TP1 and the second sensor pads TP2 may be electrically connected to the touch driving circuit 400 (see FIG. 4) disposed on the circuit board 300.

As shown in FIGS. 7 and 8, the sensor electrode layer SENL may include the driving electrodes TE and the sensing electrodes RE in the touch sensor area TSA, and may sense a touch of an object or a person using the mutual capacitance between the driving electrodes TE and the sensing electrodes RE.

Figure 9:
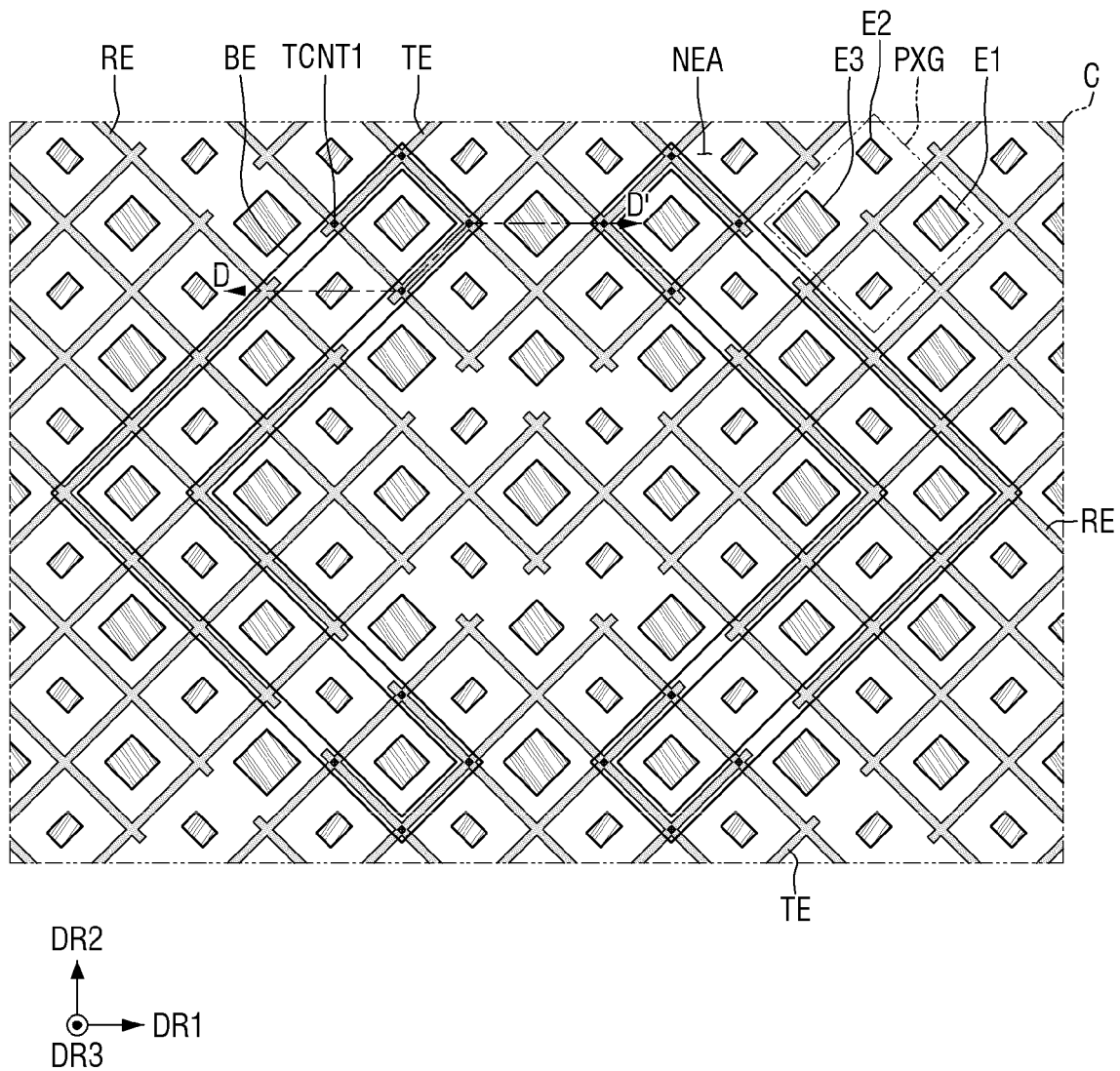
FIG. 9 is a layout diagram showing in detail area C of FIG. 8.

FIG. 9 is a layout diagram showing in detail area C of FIG. 8.

Referring to FIG. 9, the driving electrodes TE, the sensing electrodes RE, and the dummy patterns DE may be disposed on the same layer and spaced apart from each other. That is, a gap may be formed between the driving electrode TE and the sensing electrode RE. Further, a gap may be formed between the driving electrode TE and the dummy pattern DE (FIG. 8) and between the sensing electrode RE and the dummy pattern DE.

The bridge lines BE may be disposed on a different layer from the driving electrodes TE and the sensing electrodes RE.

One side of the bridge line BE may be connected to any one driving electrode TE among the driving electrodes TE adjacent in the second direction DR2 through first touch contact holes TCNT1. The other side of the bridge line BE may be connected to another driving electrode TE among the driving electrodes TE adjacent in the second direction DR2 through the first touch contact holes TCNT1.

Each of the driving electrodes TE, the sensing electrodes RE, and the bridge lines BE may be formed in a mesh structure or a net structure in plan view. Further, each of the dummy patterns DE (FIG. 8) may also be formed in a mesh structure or a net structure in plan view. Accordingly, each of the driving electrodes TE, the sensing electrodes RE, the bridge lines BE, and the dummy patterns DE may not overlap emission areas E1, E2, and E3. Therefore, it is possible to prevent the decrease in the luminance of the light that occurs when the light emitted from the emission areas E1, E2, and E3 is blocked by the driving electrodes TE, the sensing electrodes RE, the bridge lines BE, and the dummy patterns DE.

Alternatively, each of the driving electrodes TE, the sensing electrodes RE, the bridge lines BE, and the dummy patterns DE may be formed in an entire surface structure rather than a mesh structure or a net structure in plan view. In order to prevent the decrease in the luminance of the light emitted from the emission areas E1, E2, and E3 due to the driving electrodes TE, the sensing electrodes RE, the bridge lines BE, and the dummy patterns DE, the driving electrodes TE, the sensing electrodes RE, the bridge lines BE, and the dummy patterns DE may be made of a transparent conductive material, such as ITO or IZO, capable of transmitting light.

The emission areas E1, E2, and E3 may include first emission areas E1 emitting light of a first color, second emission areas E2 emitting light of a second color, and third emission areas E3 emitting light of a third color. For example, the first color may be red, the second color may be green, and the third color may be blue.

Each of the first emission areas E1, the second emission areas E2, and the third emission areas E3 may have a rhombus planar shape or a rectangular planar shape, but the present disclosure is not limited thereto. Each of the first emission areas E1, the second emission areas E2, and the third emission areas E3 may have a polygonal shape other than a quadrilateral shape, a circular shape, or an elliptical shape in plan view. Further, although FIG. 9 illustrates that the third emission area E3 has the largest area and the second emission area E2 has the smallest area, the present disclosure is not limited thereto.

One first emission area E1, two second emission areas E2, and one third emission area E3 may be defined as one pixel emission group PXG for expressing a white gray level. That is, light emitted from one first emission area E1, light emitted from two second emission areas E2, and light emitted from one third emission area E3 may be combined to express the white gray level.

The second emission areas E2 may be arranged in odd rows. The second emission areas E2 may be arranged side by side in the first direction DR1 in each of the odd rows. In each of the odd rows, any one of the second emission areas E2 adjacent in the first direction DR1 has a long side in one direction and a short side in the other direction, whereas another one has a long side in the other direction and a short side in one direction. One direction may be a direction between the first direction DR1 and the second direction DR2, and the other direction may be a direction intersecting the one direction DR1.

The first emission areas E1 and the third emission areas E3 may be disposed in even rows. The first emission areas E1 and the third emission areas E3 may be arranged side by side in the first direction DR1 in each of the even rows. The first emission areas E1 and the third emission areas E3 may be alternately arranged in each of the even rows.

The second emission areas E2 may be arranged in odd columns. The second emission areas E2 may be arranged side by side in the second direction DR2 in each of the odd columns. In each of the odd columns, any one of the second emission areas E2 adjacent in the second direction DR2 has a long side in one direction and a short side in the other direction, whereas another one has a long side in the other direction and a short side in one direction.

The first emission areas E1 and the third emission areas E3 may be arranged in even columns. The first emission areas E1 and the third emission areas E3 may be arranged side by side in the second direction DR2 in each of the even columns. The first emission areas E1 and the third emission areas E3 may be alternately arranged in each of the even columns.

Figure 10:
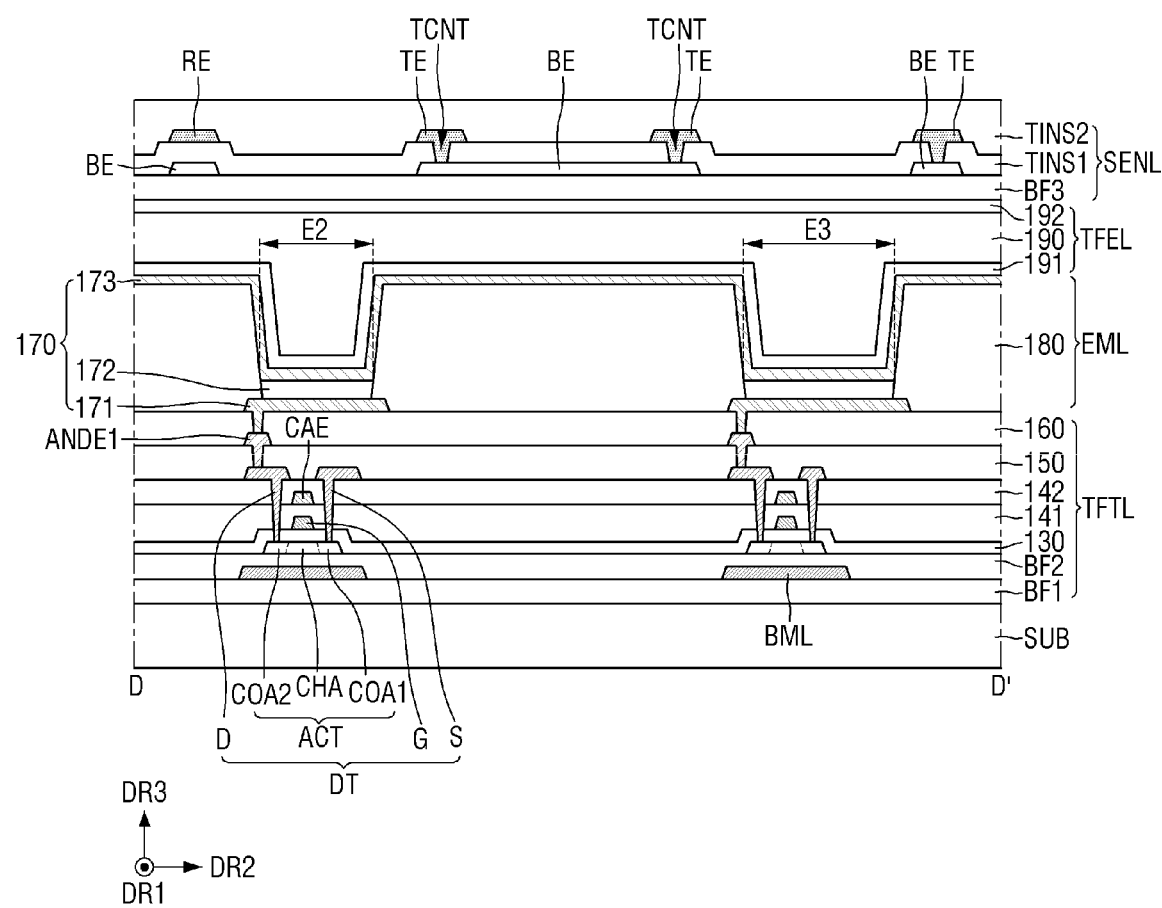
FIG. 10 is a cross-sectional view showing an example of a plane taken along line D-D' of FIG. 9.

FIG. 10 is a cross-sectional view showing an example of a plane taken along line D-D' of FIG. 9.

Referring to FIG. 10, the display panel 100 may include the substrate SUB, the thin film transistor layer TFTL disposed on the substrate SUB, the light emitting element layer EML disposed on the thin film transistor layer TFTL, the encapsulation layer TFEL covering the light emitting element layer EML, and the sensor electrode layer SENL disposed on the encapsulation layer TFEL.

Specifically, the thin film transistor layer TFTL may include a first buffer layer BF1 disposed on the substrate SUB, a second buffer layer BF2 covering a light blocking layer BML on the first buffer layer BF1, a gate insulating layer 130 covering an active layer ACT on the second buffer layer BF2, a first interlayer insulating layer 141 covering a gate electrode G on the gate insulating layer 130, a second interlayer insulating layer 142 covering a capacitor electrode CAE on the first interlayer insulating layer 141, a first organic layer 150 covering a first electrode S and a second electrode D on the second interlayer insulating layer 142, and a second organic layer 160 covering an anode connection electrode ANDE1 on the first organic layer 150.

The substrate SUB may be formed of an insulating material such as polymer resin. For example, the first substrate SUB1 and the second substrate SUB2 may be made of polyimide. Each of the first substrate SUB1 and the second substrate SUB2 may be a flexible substrate which can be bent, folded and rolled.

The first buffer layer BF1 and the second buffer layer BF2 are used for protecting the thin film transistor layer TFTL and the light emitting element layer EML from moisture permeating through the substrate SUB.

Each of the first buffer layer BF1 and the second buffer layer BF2 may be formed of multiple layers in which one or more inorganic layers of a silicon nitride layer, a silicon oxynitride layer, a silicon oxide layer, a titanium oxide layer and an aluminum oxide layer are alternately stacked.

The light blocking layer BML is used for preventing a leakage current of the active layer ACT due to light incident from the substrate SUB. To this end, the light blocking layer BML may overlap at least a channel area CHA of the active layer ACT on the second buffer layer BF2. Alternatively, the light blocking layer BML may overlap the entire active layer ACT.

The light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. Alternatively, the light blocking layer BML may be an organic layer including a black pigment.

The active layer ACT may include the channel area CHA where a channel is formed due to a potential difference, and a first electrode area COA1 and a second electrode area COA2 positioned on both sides of the channel area CHA.

The active layer ACT may include polycrystalline silicon, monocrystalline silicon, low-temperature polycrystalline silicon, amorphous silicon, or an oxide semiconductor material.

When the active layer ACT includes polycrystalline silicon or an oxide semiconductor material, the first electrode area COA1 and the second electrode area COA2 may be conductive areas obtained by ion doping.

The gate insulating layer 130 may be formed of an inorganic insulating layer of a silicon nitride layer, a silicon oxynitride layer, a silicon oxide layer, a titanium oxide layer, or an aluminum oxide layer.

The gate electrode G on the gate insulating layer 130 overlaps the channel area CHA of the active layer ACT in the third direction DR3.

The gate electrode G may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first interlayer insulating layer 141 may be formed of a silicon nitride layer, a silicon oxynitride layer, a silicon oxide layer, a titanium oxide layer, or an aluminum oxide layer. The first interlayer insulating layer 141 may include a plurality of inorganic insulating layers.

The capacitor electrode CAE on the first interlayer insulating layer 141 may overlap a part of the gate electrode G in the third direction DR3. The capacitor C1 (see FIG. 6) may be provided by the overlapping area between the capacitor electrode CAE and the gate electrode G. In this case, the gate electrode G is the gate electrode of the driving transistor DT (see FIG. 6).

The capacitor electrode CAE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second interlayer insulating layer 142 may be formed of an inorganic insulating layer of a silicon nitride layer, a silicon oxynitride layer, a silicon oxide layer, a titanium oxide layer, or an aluminum oxide layer.

The first electrode S and the second electrode D may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The first electrode S may be connected to the first electrode area COA1 of the active layer ACT through a contact hole penetrating the gate insulating layer 130, the first interlayer insulating layer 141, and the second interlayer insulating layer 142.

The second electrode D may be connected to the second electrode area COA2 of the active layer ACT through a contact hole penetrating the gate insulating layer 130, the first interlayer insulating layer 141, and the second interlayer insulating layer 142.

The first organic layer 150 may be formed of an organic layer such as acryl resin, epoxy resin, phenolic resin, polyamide resin, polyimide resin and the like.

The anode connection electrode ANDE1 may be connected to the second electrode D through a contact hole penetrating the first organic layer 150.

The anode connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

Although FIG. 10 illustrates a case where the thin film transistor layer TFTL includes the anode connection electrode ANDE1 between the first organic layer 150 and the second organic layer 160, this is merely an example. That is, the thin film transistor layer TFTL according to one embodiment may further include one or more additional organic layers (not shown) disposed between the first organic layer 150 and the second organic layer 160, and one or more additional anode connection electrodes (not shown) respectively disposed on the one or more additional organic layers.

The second organic layer 160 may be formed of an organic layer such as acryl resin, epoxy resin, phenolic resin, polyamide resin, polyimide resin and the like.

Although FIG. 10 illustrates a case where the thin film transistor layer TFTL includes a transistor having a top gate structure including the gate electrode G positioned above the active layer ACT, the present disclosure is not limited thereto. That is, the thin film transistor layer TFTL may include a transistor having a bottom gate structure in which the gate electrode G is positioned under the active layer ACT, or a transistor having a double gate structure in which the gate electrode G is positioned above and under the active layer ACT.

The light emitting element layer EML may be disposed on the second organic layer 160 of the thin film transistor TFTL.

The light emitting element layer EML may include a first light emitting electrode 171 corresponding to each of the first emission area E1, the second emission area E2, and the third emission area E3, a third organic layer 180 covering the edges of the first light emitting electrode 171, a light emitting layer 172 disposed on the first light emitting electrode 171, and a second light emitting electrode 173 disposed on the third organic layer 180 and the light emitting layer 172. The first light emitting electrode 171 may be an anode electrode, and the second light emitting electrode 173 may be a cathode electrode.

The first light emitting electrode 171 may be formed on the second organic layer 160. The first light emitting electrode 171 may be connected to the first connection electrode ANDE1 through a contact hole penetrating the second organic layer 160.

In a top emission structure that emits light toward the second light emitting electrode 173 with respect to the light emitting layer 172, the first light emitting electrode 171 may be formed of a single layer of molybdenum (Mo), titanium (Ti), copper (Cu), or aluminum (Al), or may be formed to have a laminated structure of aluminum and titanium (Ti/Al/Ti), a laminated structure of aluminum and ITO (ITO/Al/ITO), an APC alloy, or a laminated structure of APC alloy and ITO (ITO/APC/ITO) to increase the reflectivity. The APC alloy is an alloy of silver (Ag), palladium (Pd) and copper (Cu).

The third organic layer 180 serves to define the emission areas E2 and E3 of display pixels. To this end, the third organic layer 180 may be formed to expose a part of the first light emitting electrode 171 on the second organic layer 160. The third organic layer 180 may cover the edges of the first light emitting electrode 171. The third organic layer 180 may be formed of an organic layer such as acryl resin, epoxy resin, phenolic resin, polyamide resin, polyimide resin and the like.

The light emitting layer 172 is formed on the first light emitting electrode 171. The light emitting layer 172 may include an organic material to emit light in a predetermined color. For example, the light emitting layer 172 may include a hole transporting layer, an organic material layer, and an electron transporting layer. The organic material layer may include a host and a dopant. The organic material layer may include a material that emits predetermined light, and may be formed using a phosphorescent material or a fluorescent material.

For example, the organic material layer of the light emitting layer 172 in the first emission area E1 (see FIG. 9) emitting the light of the first color may be a phosphorescent material including a host material including carbazole biphenyl (CBP) or mCP (1,3-bis(carbazol-9-yl), and a dopant including at least one selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium)) and PtOEP (octaethylporphyrin platinum). Alternatively, the organic material layer of the emission layer 172 in the first emission area E1 (see FIG. 9) may be a fluorescent material including PBD:Eu(DBM)3(Phen) or Perylene, but the present disclosure is not limited thereto.

The organic material layer of the emission layer 172 in the second emission area E2 emitting the light of the second color may be a phosphorescent material including a host material including CBP or mCP, and a dopant material including Ir(ppy)3(fac tris(2-phenylpyridine)iridium. Alternatively, the organic material layer of the emission layer 172 in the second emission area E2 emitting the light of the second color may be a fluorescent material including tris(8-hydroxyquinolino)aluminum (Alq3), but the present disclosure is not limited thereto.

The organic material layer of the emission layer 172 in the third emission area E3 emitting the light of the third color may be a phosphorescent material including a host material including CBP or mCP, and a dopant material including (4,6-F2ppy)2Irpic or L2BD111, but the present disclosure is not limited thereto.

The second light emitting electrode 173 is formed on the light emitting layer 172. The second light emitting electrode 173 may be formed to cover the light emitting layer 172 and the third organic layer 180. The second light emitting electrode 173 may be a common layer commonly formed for the plurality of sub-pixel areas SPX. A capping layer (not shown) may be formed on the second light emitting electrode 173.

In the top emission type structure, the second light emitting electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second light emitting electrode 173 is formed of a semi-transmissive conductive material, the light emission efficiency can be increased due to a micro-cavity effect.

Meanwhile, the light emitting layer 172 may be disposed on the top surface of the first light emitting electrode 171 and the inclined surfaces of the third organic layer 180. The second light emitting electrode 173 may be disposed on the top surface of the light emitting layer 172 and the inclined surfaces of the third organic layer 180.

The light emitting element layer EML is covered with the encapsulation layer TFEL.

The encapsulation layer TFEL is used for preventing oxygen or moisture from permeating into the light emitting element layer EML, and used for protecting the light emitting element layer EML from foreign substances such as dust. The encapsulation layer TFEL may have a structure in which an inorganic insulating material and an organic insulating material are alternately stacked.

For example, the encapsulation layer TFEL may have a structure in which a first encapsulation layer 191 made of an inorganic insulating material, a second encapsulation layer 190 made of an organic insulating material, and a third encapsulation layer 192 made of an inorganic insulating material are sequentially stacked.

The inorganic insulating material of each of the first encapsulation layer 191 and the third encapsulation layer 192 may be any one of a silicon nitride layer, a silicon oxynitride layer, a silicon oxide layer, a titanium oxide layer, and an aluminum oxide layer.

The organic insulating material of the second encapsulation layer 190 may be acrylic resin, epoxy resin, phenolic resin, polyamide resin, or polyimide resin.

The sensor electrode layer SENL is disposed on the encapsulation layer TFEL. The sensor electrode layer SENL may include the sensor electrodes SE.

The sensor electrode layer SENL may include a third buffer layer BF3 on the encapsulation layer TFEL, the bridge line BE disposed on the third buffer layer BF3, a first sensor insulating layer TINS1 covering the bridge line BE, the sensor electrodes TE and RE disposed on the first sensor insulating layer TINS1, and a second sensor insulating layer TINS2 covering the sensor electrodes TE and RE.

The third buffer layer BF3 may be formed of multiple layers in which one or more inorganic layers of a silicon nitride layer, a silicon oxynitride layer, a silicon oxide layer, a titanium oxide layer and an aluminum oxide layer are alternately stacked. The third buffer layer BF3 may be formed by a lamination process using a flexible material, a spin coating process using a solution-type material, a slit die coating process, or a deposition process. The third buffer layer BF3 may be omitted.

The bridge line BE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The first sensor insulating layer TINS1 may be made of a material having an insulating function and an optical function. The first sensor insulating layer TINS1 may be formed of an organic layer such as acryl resin, epoxy resin, phenolic resin, polyamide resin, polyimide resin or the like. Alternatively, the first sensor insulating layer TINS1 may be formed of an inorganic layer, for example, a silicon nitride layer, a silicon oxynitride layer, a silicon oxide layer, a titanium oxide layer, or an aluminum oxide layer.

The first sensor insulating layer TINS1 may be formed by a lamination process using a flexible material, a spin coating process using a solution-type material, a slit die coating process, or a deposition process.

The driving electrodes TE and sensing electrodes RE may be disposed on the first sensor insulating layer TINS1.

The driving electrodes TE and the sensing electrodes RE do not overlap the emission areas E2 and E3. The driving electrodes TE and the sensing electrodes RE may be formed of a single layer containing molybdenum (Mo), titanium (Ti), copper (Cu), or aluminum (Al), or may be formed to have a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The driving electrodes TE and the sensing electrodes RE may be disposed on the same layer, and may be simultaneously formed using the same material.

The second sensor insulating layer TINS2 may be a layer having an insulating function and an optical function. The second sensor insulating layer TINS2 may be formed of an organic layer such as acryl resin, epoxy resin, phenolic resin, polyamide resin, polyimide resin or the like. Alternatively, the second sensor insulating layer TINS2 may further include an inorganic layer disposed above or under the organic layer. The inorganic layer of the second sensor insulating layer TINS2 may be a silicon nitride layer, a silicon oxynitride layer, a silicon oxide layer, a titanium oxide layer, or an aluminum oxide layer.

The second sensor insulating layer TINS2 may be formed by a lamination process using a flexible material, a spin coating process using a solution-type material, a slit die coating process, or a deposition process.

Alternatively, the second sensor insulating layer TINS2 may be made of an insulating material that is laminated in a relatively low temperature environment so as not to damage insulating materials and conductive materials disposed thereunder. For example, the second sensor insulating layer TINS2 may be made of an organic material of a negative photoresist. That is, the negative photoresist may be deposited even at a temperature of about 90° C., so that it is possible to prevent deformation caused by a high temperature environment.

As described above with reference to FIGS. 1 to 6, the display panel 100 according to one embodiment includes the substrate SUB, the thin film transistor layer TFTL on the substrate SUB, the light emitting element layer EML on the thin film transistor layer TFTL, the encapsulation layer TFEL covering the light emitting element layer EML, and the sensor electrode layer SENL on the encapsulation layer TFEL.

The substrate SUB includes the main region MA corresponding to the light emitting surface of the display device 10 and the sub-region SBA protruding from one side of the main region MA.

The main region MA includes the display area DA in which the plurality of sub-pixel areas SPX emitting light for displaying an image are arranged, and the non-display area NDA disposed around the display area DA.

The sub-region SBA includes the bending area BA that is deformed to be bent. Further, the sub-region SBA includes the first sub-region SB1 connected to the non-display area NDA and the second sub-region SB2 connected to the bending area BA.

When the bending area BA is deformed to be bent, the second sub-region SB2 is disposed on the rear surface of the substrate SUB and overlaps the first sub-region SB1 and the main region MA.

The display driving circuit 200 may be mounted in the second sub-region SB2.

Further, the display pads DP and the sensor pads TP1 and TP2 (see FIG. 7) may be disposed in the second sub-region SB2. The display pads DP and the sensor pads TP1 and TP2 (see FIG. 7) may be arranged side by side at the edge of the second sub-region SB2.

The display pads DP and the sensor pads TP1 and TP2 may be electrically connected to a separate circuit board 300.

The thin film transistor layer TFTL is disposed in the display area DA on the substrate SUB. The thin film transistor layer TFTL includes the pixel driving unit PDU corresponding to each of the plurality of sub-pixel areas SPX.

The light emitting element layer EML includes the light emitting element LEL corresponding to each of the plurality of sub-pixel areas SPX.

The pixel driving unit PDU of each of the plurality of sub-pixel areas SPX may be connected to the scan line SCL, the data line DL, the first power line VDL, and the second power line VSL.

Further, the pixel driving unit PDU may be further connected to the initialization control line ICL, the gate control line GCL, the emission control line ECL, the gate initialization voltage line VGIL, and the emission initialization voltage line VAIL.

The scan line SCL transmits the scan signal corresponding to whether or not data is written.

The data line DL transmits the data signal corresponding to the luminance of each sub-pixel area SPX for image display.

The first power line VDL and the second power line VSL supply a first power and a second power for driving the light emitting element LEL, respectively. The first power supply and the second power supply are different from each other. For example, the first power supply may be a high-potential power supply, and the second power supply may be a low-potential power supply.

The initialization control line ICL and the gate control line GCL transmit gate signals corresponding to whether or not main nodes of the pixel driving unit PDU are initialized.

The emission control line ECL transmits the emission gate signal corresponding to whether or not light emission is started.

The gate initialization voltage line supplies the first initialization voltage.

The emission initialization voltage line supplies the second initialization voltage.

The pixel driving unit PDU may include the driving transistor DT, the first transistor ST1, the second transistor ST2, the third transistor ST3, the fourth transistor ST4, the fifth transistor ST5, and the sixth transistor ST6.

The driving transistor DT is disposed in series with the light emitting element LEL between the first power line VDL and the second power line VSL.

The first transistor ST1 is turned on by the scan signal of the scan line SCL, and is disposed between the gate electrode of the driving transistor DT and the second electrode of the driving transistor DT.

The second transistor ST2 is turned on by the scan signal of the scan line SCL, and is disposed between the data line DL and the first electrode of the driving transistor DT.

When the scan signal is transmitted through the scan line SCL, the first transistor ST1 and the second transistor ST2 are turned on. At this time, the gate electrode of the driving transistor DT and the second electrode of the driving transistor DT are maintained at the same potential through the turned-on first transistor ST1. Further, the data signal of the data line DL is transferred to the first electrode of the driving transistor DT through the turned-on second transistor ST2.

Accordingly, when the potential difference between the gate electrode and the first electrode of the driving transistor DT exceeds the threshold voltage, the driving transistor DT is turned on.

The third transistor ST3 is disposed between the gate initialization voltage line VGIL and the gate electrode of the driving transistor DT. When the third transistor ST3 is turned on by the initialization control signal of the initialization control line ICL, the potential of the gate electrode of the driving transistor DT is initialized to the first initialization voltage of the gate initialization voltage line VGIL.

The fourth transistor ST4 is disposed between the emission initialization voltage line VAIL and the first light emitting electrode of the light emitting element LEL. When the fourth transistor ST4 is turned on by the gate control signal of the gate control line GCL, the potential of the first light emitting electrode of the light emitting element LEL is initialized to the second initialization voltage of the emission initialization voltage line VAIL.

The fifth transistor ST5 is disposed between the first power line VDL and the first electrode of the driving transistor DT.

The sixth transistor ST6 is disposed between the second electrode of the driving transistor DT and the first light emitting electrode of the light emitting element LEL.

The second light emitting electrode of the light emitting element LEL is connected to the second power line VSL.

When the fifth transistor ST5 and the sixth transistor ST6 are turned on by the emission gate signal of the emission control line ECL, the driving transistor DT and the light emitting element LEL are connected in series between the first power line VDL and the second power line VSL, so that the driving current generated by the turned-on driving transistor DT is supplied to the light emitting element LEL.

The display panel 100 may further include the first scan driver SDC1 and the second scan driver SDC2 that output the scan signal to the scan lines SCL of the thin film transistor layer TFTL. Hereinafter, for simplicity of description, the first scan driver SDC1 and the second scan driver SDC2 are collectively referred to as the scan driver.

The scan drivers SDC1 and SDC2 may output the scan signal to the scan lines SCL of the display area DA in response to the control signals of the control signal lines CSL.

Further, the scan drivers SDC1 and SDC2 according to one example may output the emission gate signal to the emission control lines ECL of the display area DA in response to the control signals of the control signal lines CSL.

As described above with reference to FIGS. 7 to 10, the sensor electrode layer SENL on the encapsulation layer TFEL includes at least the sensor electrodes SE disposed in the touch sensor area TSA corresponding to the display area DA. The sensor electrodes SE generate a mutual capacitance to sense a touch of an object or a person.

For example, the sensor electrodes SE include the driving electrodes TE connected in the second direction DR2 through the bridge line BE, and the sensing electrodes RE connected in the first direction DR1.

The sensor electrode layer SENL may include the bridge line BE disposed on the encapsulation layer TFEL, the first sensor insulating layer TINS1 disposed on the encapsulation layer TFEL and covering the bridge line BE, the sensor electrodes SE disposed on the first sensor insulating layer TINS1, and the second sensor insulating layer TINS2 covering the sensor electrodes SE.

The second sensor insulating layer TINS2 may be made of an organic material of a negative photoresist that may be laminated at a relatively low temperature of 90° C. Accordingly, it is possible to prevent the pattern shape of the insulating material or the conductive material disposed under the second sensor insulating layer TINS2 from being damaged during the arrangement process of the second sensor insulating layer TINS2d.

However, the negative photoresist is disadvantageous in that it is susceptible to moisture permeation. Therefore, when the second sensor insulating layer TINS2 is made of the negative photoresist, corrosion of a metal material adjacent to the second sensor insulating layer TINS2 may be caused, which may result in disconnection or poor connection.

In particular, in the bending area BA, insulating layers made of an inorganic material susceptible to a bending stress need to be removed. Accordingly, the lines of the first sub-region SB1 may be jumped to the connection lines of the bending area BA, and connected to the second sub-region SB2. In this case, the contact holes for jumping in the bending area BA are a factor of shortening the moisture permeation path, so that poor connection or disconnection of the lines made of a metal material and disposed in the first sub-region SB1 and the second sub-region SB2 may become serious.

Accordingly, in a display device of each embodiment to be described later, the lines made of a metal material and disposed in the first sub-region SB1 and the second sub-region SB2 are protected from moisture permeation through the second sensor insulating layer TINS2 made of a negative photoresist and the contact holes.

Figure 11:
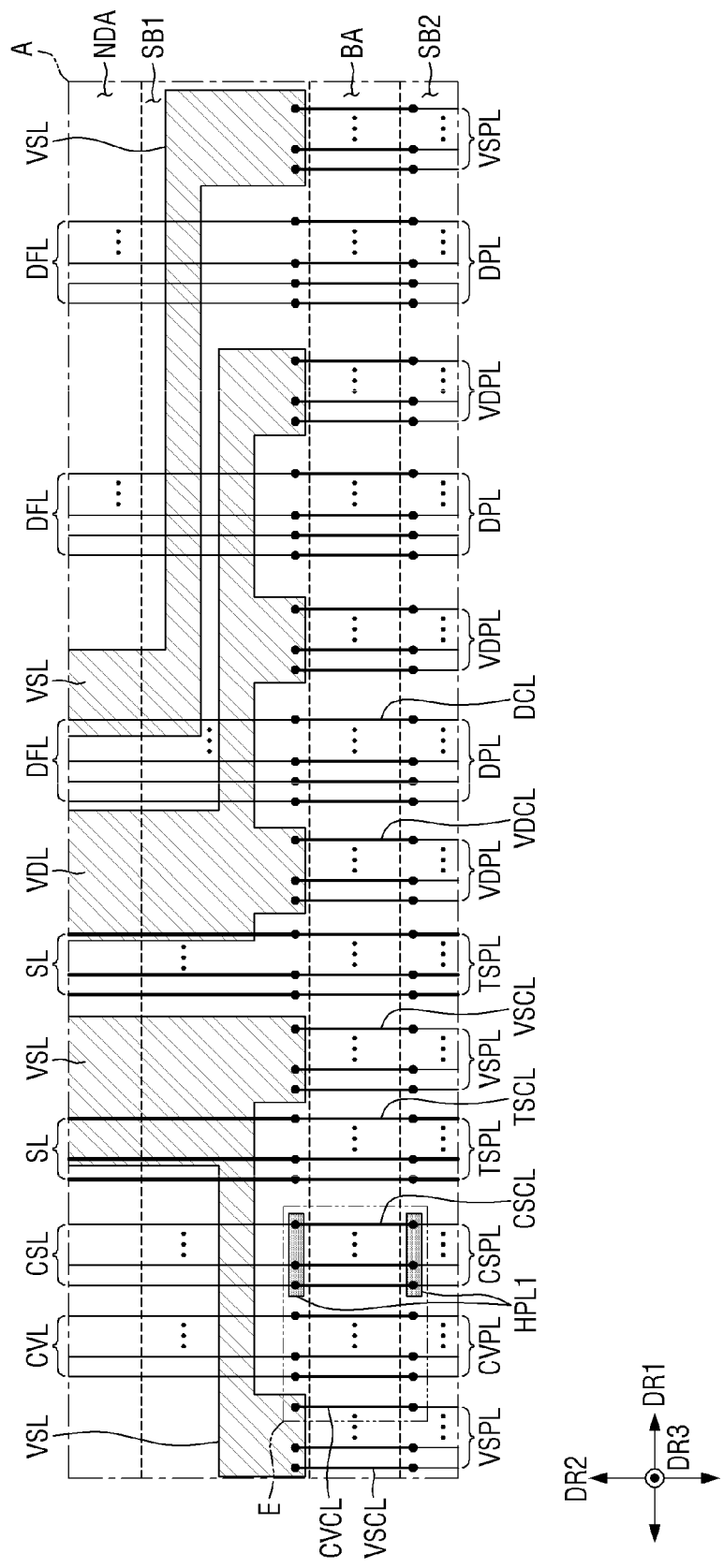
FIG. 11 is a layout diagram showing area A of FIG. 2 according to a first embodiment.
Figure 12:
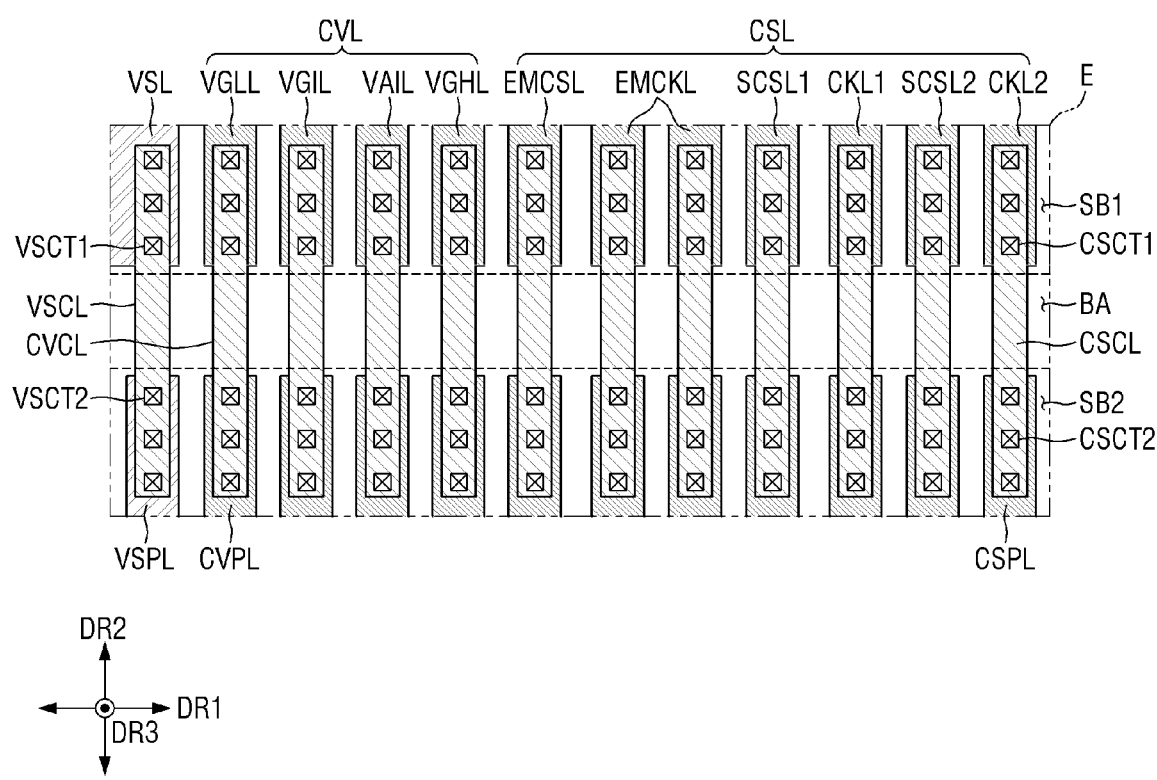
FIGS. 12 and 13 are plan views showing in detail an example of area E of FIG. 11.
Figure 13:
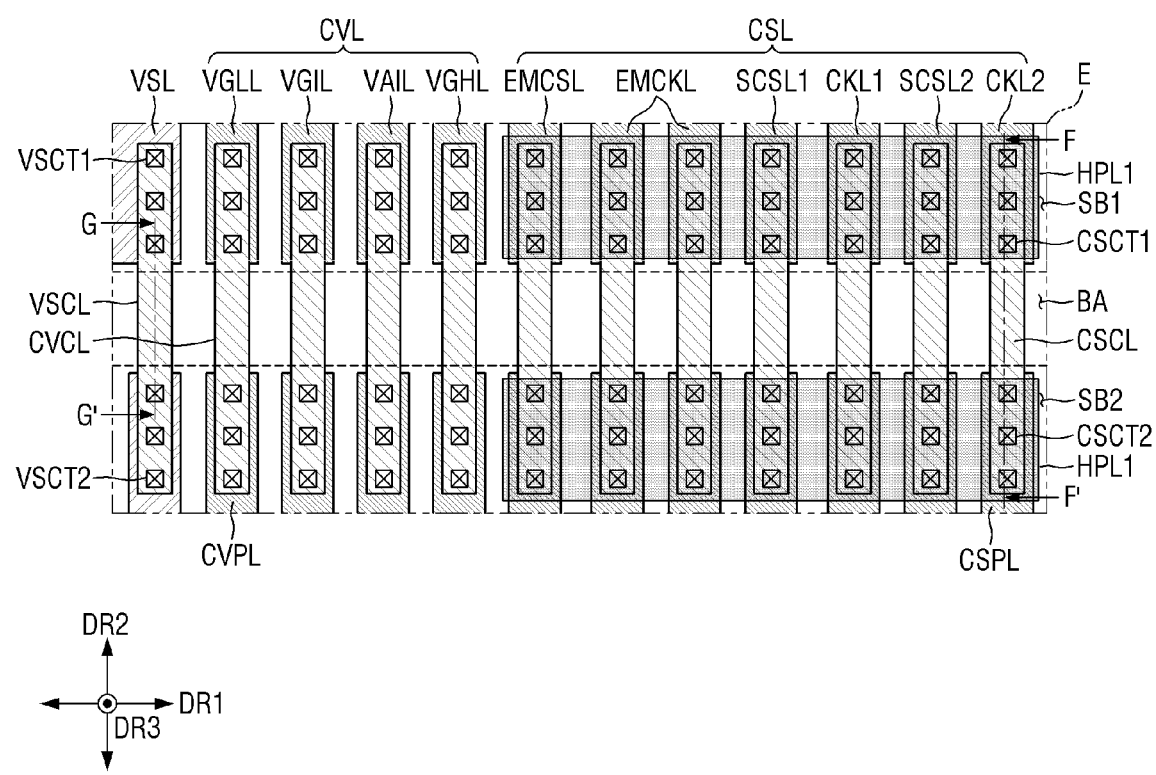
Figure 14:
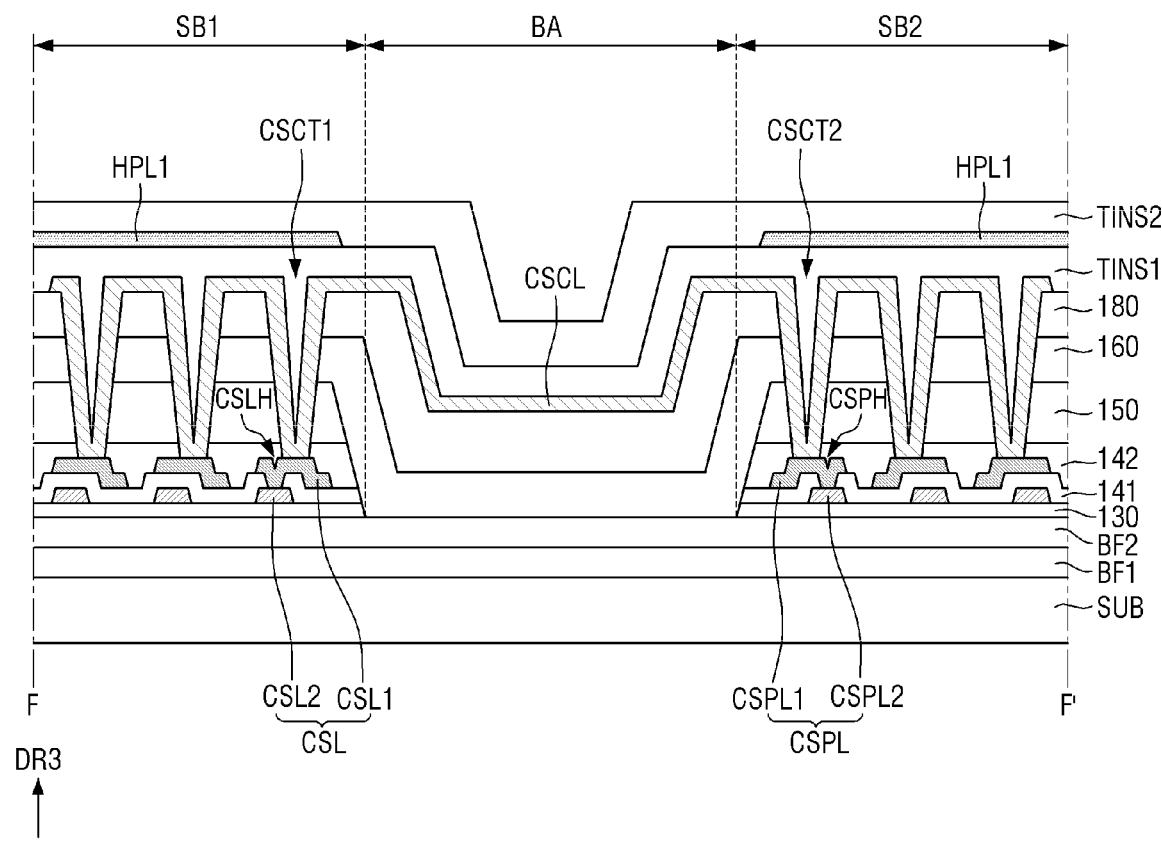
FIG. 14 is a cross-sectional view showing an example of a plane taken along line F-F' of FIG. 13.
Figure 15:
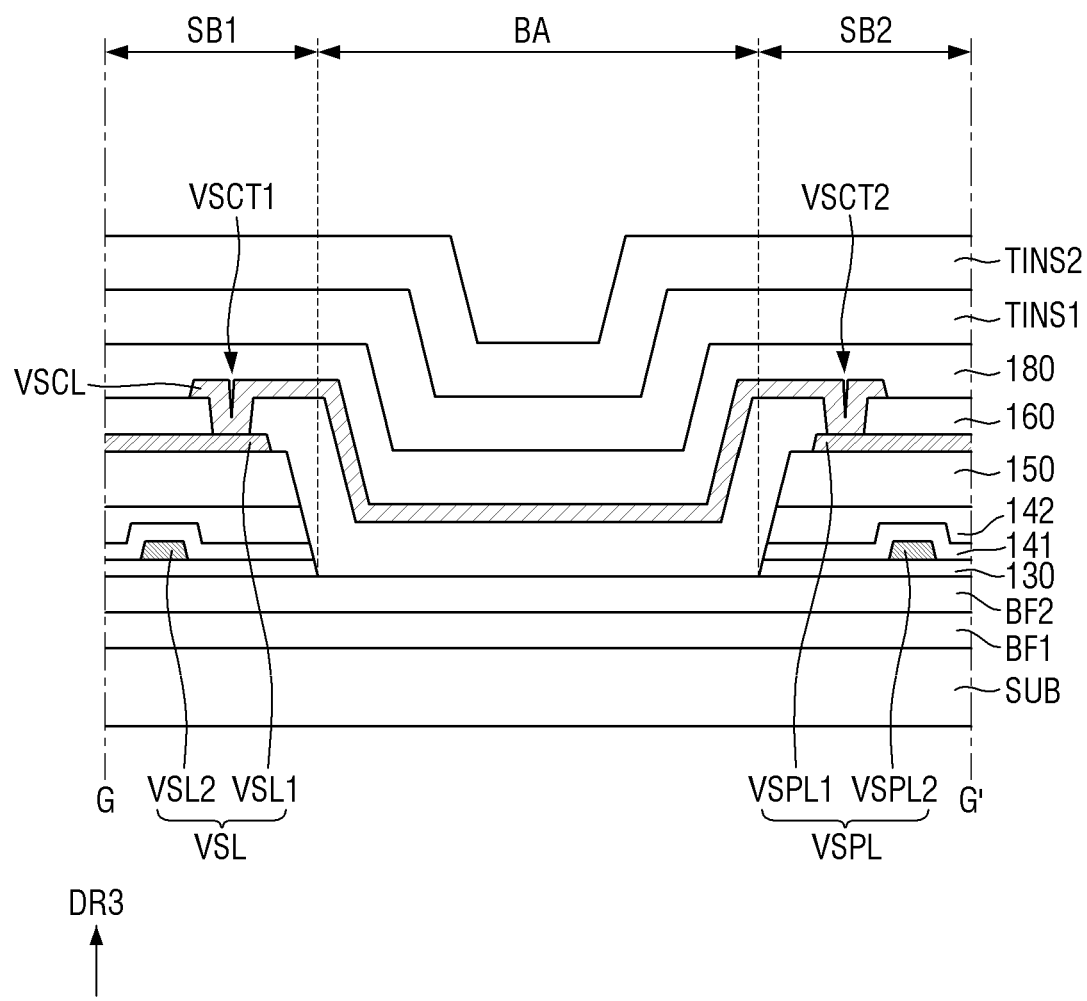
FIG. 15 is a cross-sectional view showing an example of a plane taken along line G-G' of FIG. 13.

FIG. 11 is a layout diagram showing area A of FIG. 2 according to a first embodiment. FIGS. 12 and 13 are plan views showing in detail an example of area E of FIG. 11. FIG. 14 is a cross-sectional view showing an example of a plane taken along line F-F' of FIG. 13. FIG. 15 is a cross-sectional view showing an example of a plane taken along G-G' of FIG. 13.

Figure 16:
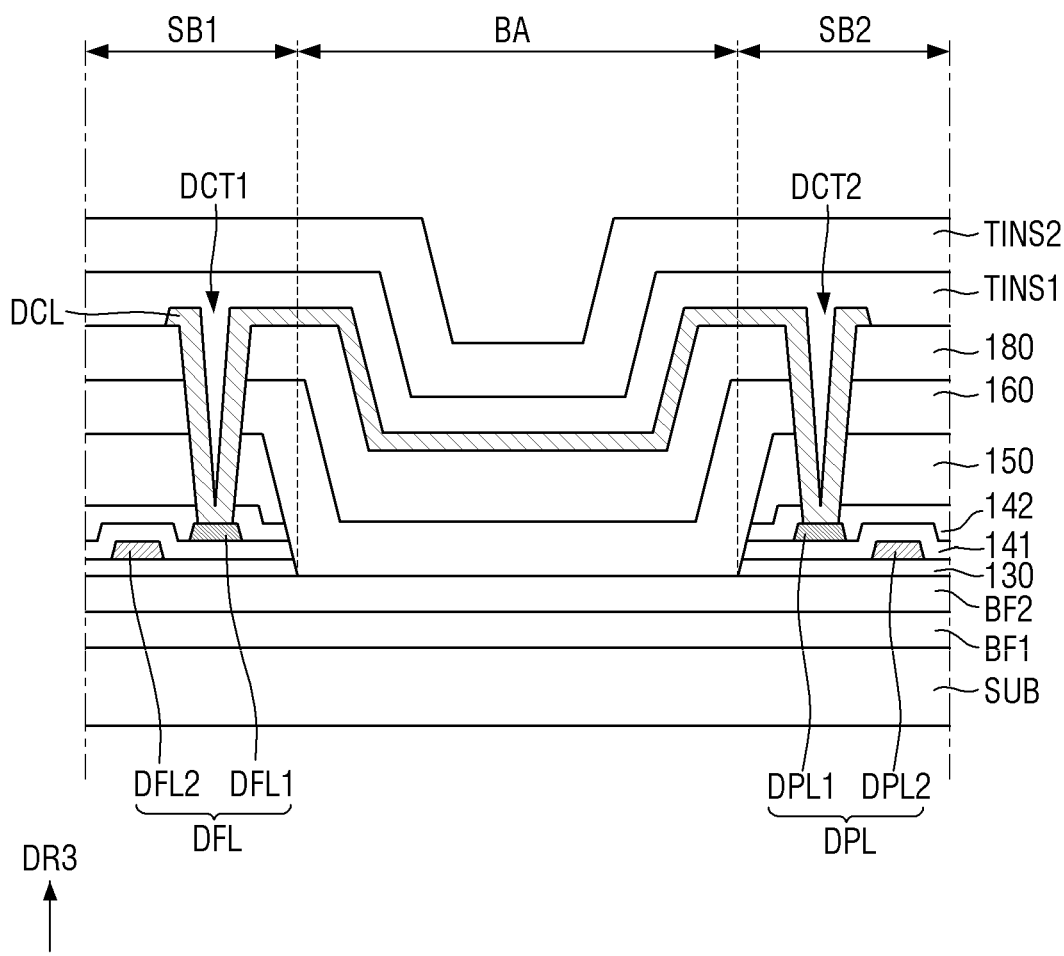
FIG. 16 is a cross-sectional view showing an example of a data fan-out line, a data connection line, and a data pad line of FIG. 11.
Figure 17:
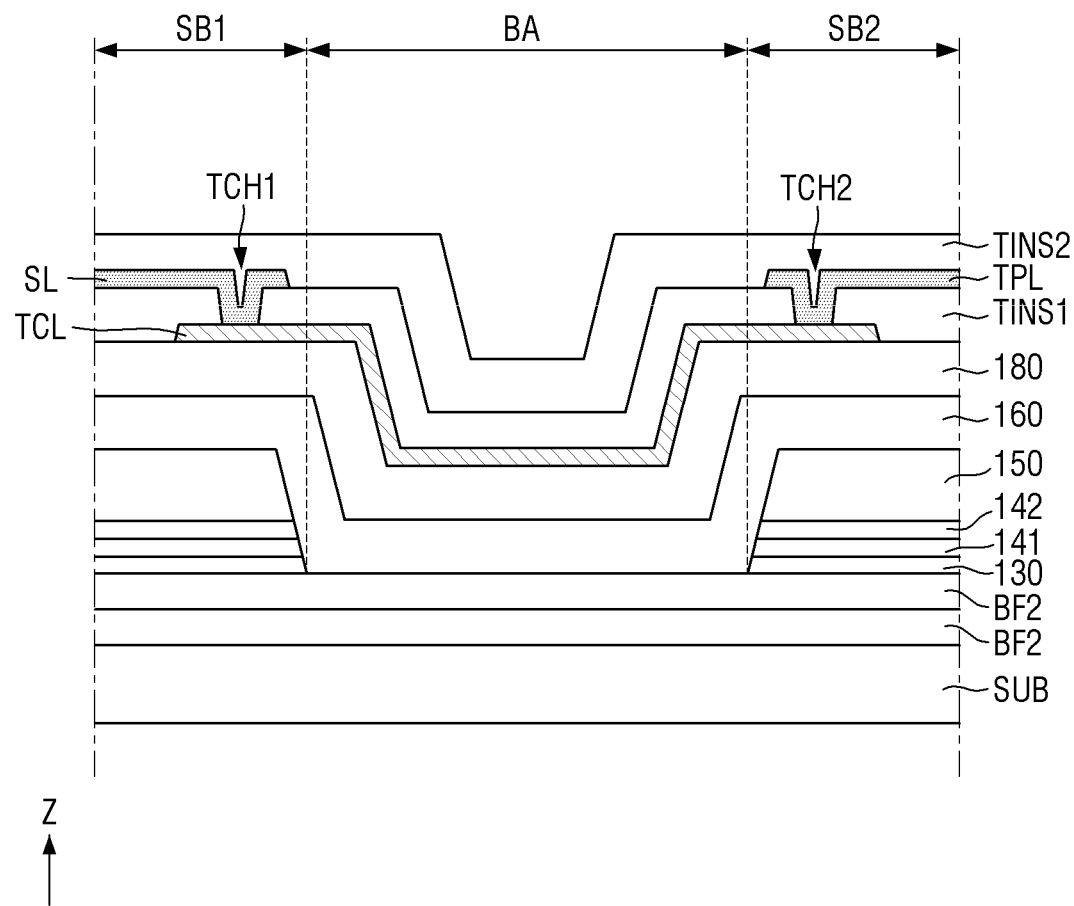
FIG. 17 is a cross-sectional view showing an example of a sensor line, a sensor connection line, and a sensor pad line of FIG. 11.

FIG. 16 is a cross-sectional view showing an example of a data fan-out line, a data connection line, and a data pad line of FIG. 11. FIG. 17 is a cross-sectional view showing an example of a sensor line, a sensor connection line, and a sensor pad line of FIG. 11.

First, as described above, the display panel 100 according to one embodiment includes the substrate SUB including the main region MA including the display area DA in which the plurality of sub-pixel areas SPX are arranged and the non-display area NDA disposed around the display region DA, and the sub-region SBA including the bending area BA that protrudes from one side of the main region MA and is deformed to be bent, the thin film transistor layer TFTL disposed in the display area DA on the substrate SUB, the scan drivers SDC1 and SDC2 for outputting the scan signal to the scan lines SCL of the thin film transistor layer TFTL, the light emitting element layer EML disposed on the thin film transistor layer TFTL, the sensor electrode layer SENL including the first sensor insulating layer TINS1 disposed on the encapsulation layer TFEL covering the light emitting element layer EML and the second sensor insulating layer TINS2 covering the sensor electrodes SE on the first sensor insulating layer TINS1, and the control signal lines CSL disposed in the non-display area NDA and the first sub-region SB1 of the sub-region SBA connected thereto and connected to the scan drivers SDC1 and SDC2.

Referring to FIGS. 11 and 12, the display panel 100 according to a first embodiment A1 may further include control connection lines CSCL disposed in the bending area BA and respectively connected to the control signal lines CSL through first control line contact holes CSCT1.

The control signal lines CSL provide control signals for controlling the driving of the scan drivers SDC1 and SDC2.

For example, as shown in FIG. 12, the control signal lines CSL may include one or more scan output control lines SCSL1 and SCSL2 for supplying at least one scan timing control signal corresponding to the output timing of the scan signal, and two or more scan clock lines CKL1 and CKL2 for supplying two or more scan clock signals corresponding to the generation of the scan signal.

Further, when the scan drivers SDC1 and SDC2 output the emission gate signal to the emission control lines ECL, the control signal lines CSL may further include an emission output control line EMCSL for supplying at least one emission timing control signal corresponding to the output timing of the emission gate signal, and two or more emission clock lines EMCKL for supplying two or more emission clock signals corresponding to the generation of the emission gate signal.

The scan drivers SDC1 and SDC2 may output the scan signal to the scan lines SCL in response to the control signals of the control signal lines CSL, and may output the emission gate signal to the emission control lines ECL.

However, the control signals of the control signal lines CSL vary from a positive polarity (+) to a negative polarity (−) and vary from a negative polarity (−) to a positive polarity (+).

Since the control signals whose polarity varies are transmitted, neighboring ions may be induced to the control signal lines CSL.

Further, as described above, the second sensor insulating layer TINS2 made of a negative photoresist is susceptible to moisture permeation, so that the movement of ions may be further facilitated by moisture generated by the second sensor insulating layer TINS2. Accordingly, the deformation in which the organic layers 150, 160, and 180 around the first control line contact hole CSCT1 are separated from the metal material by the reaction to moisture and ions from the second sensor insulating layer TINS2 may be caused.

To prevent this, referring to FIGS. 13 and 14, the display panel 100 according to the first embodiment A1 further includes a first hole protection layer HPL1 disposed between the second sensor insulating layer TINS2 and the control connection lines CSCL and corresponding to the first control line contact holes CSCT1.

As shown in FIG. 13, the first hole protection layer HPL1 may be formed in an island-shaped pattern overlapping the first control line contact holes CSCT1. The first hole protection layer HPL1 may be maintained in a floating state.

As shown in FIG. 14, each of the control signal lines CSL of the first sub-region SB1 may have a jumping structure in which a control line upper part CSL1 on the first interlayer insulating layer 141 and a control line lower part CSL2 on the gate insulating layer 130 are combined. The control line upper part CSL1 may be electrically connected to the control line lower part CSL2 through a first control line jump hole CSLH penetrating the first interlayer insulating layer 141.

When the control line upper part CSL1 is disposed on the first interlayer insulating layer 141, the control connection lines CSCL of the bending area BA may be disposed on any one of the first organic layer 150 covering the first interlayer insulating layer 141, the second organic layer 160, and the third organic layer 180.

For example, as shown in FIG. 14, each of the control connection lines CSCL may be disposed on the third organic layer 180 similarly to the second light emitting electrode 173 (see FIG. 10).

As described above, when the control signal lines CSL have the jumping structure in which the control line upper part CSL1 and the control line lower part CSL2 are combined, the lines of the non-display area NDA and the first sub-region SB1 may be implemented with a smaller number of conductive layers compared to the number of the lines while avoiding a short circuit between the lines disposed in the non-display area NDA and the first sub-region SB1.

The first hole protection layer HPL1 is covered with the second sensor insulating layer TINS2, and overlaps the first control line contact holes CSCT1 for connection between the control signal lines CSL and the control connection lines CSCL.

The first hole protection layer HPL1 blocks the gap between the first control line contact hole CSCT1 and the second sensor insulating layer TINS2. Accordingly, moisture or ions generated by the second sensor insulating layer TINS2 are blocked by the first hole protection layer HPL1 and hardly reach the first control line contact holes CSCT1. Therefore, the organic layers around the first control line contact hole CSCT1 are deformed in response to moisture or ions, so that it is possible to prevent a disconnection defect or a poor connection defect of the control signal lines CSL and the control connection lines CSCL made of a metal material.

For example, as shown in FIG. 14, when the control connection line CSCL is disposed on the third organic layer 180 similarly to the second light emitting electrode 173 (see FIG. 10), the first hole protection layer HPL1 may be formed on the same layer as the sensor electrode (SE of FIG. 7; TE and RE of FIG. 10) covered with the second sensor insulating layer TINS2. However, this is merely an example, and the first hole protection layer HPL1 may be formed of any layer within a range that satisfies the condition that allows it to be disposed in an island-shaped pattern between the second sensor insulating layer TINS2 and the control connection line CSCL.

That is, the control connection lines CSCL may be disposed on the first organic layer 150 or the second organic layer 160 rather than the third organic layer 180 within a range in which they are not short-circuited with other lines.

For another example, although not shown separately, when the control connection lines CSCL are disposed on the first organic layer 150 similarly to the anode connection electrode ANDE1, the first hole protection layer HPL1 may be disposed on the same layer as the first light emitting electrode 171 on the second organic layer 160 covering the anode connection electrode ANDE1.

FIG. 12 illustrates a case where the control signal lines CSL are disposed on the same layer, and the control connection lines CSCL are disposed on the same layer. However, this is merely an example, and the implementation of the control signal lines CSL and the control connection lines CSCL is not limited to that illustrated in FIG. 12.

FIG. 12 illustrates a case where three first control line contact holes CSCT1 are continuously arranged in one direction. However, this is merely an example, and the arrangement of the first control line contact hole CSCT1 is not limited to that illustrated in FIG. 12. That is, only one first line contact hole CSCT1 may be disposed, or a plurality of first line contact holes CSCT1 may be arranged side by side in the first direction DR1 and the second direction DR2.

As shown in FIG. 11, the sensor electrode layer SENL of the display panel 100 according to the first embodiment A1 may further include the sensor lines SL disposed in the touch peripheral area TPA (see FIG. 7) and extending to the non-display area NDA and the first sub-region SB1, sensor connection lines TSCL disposed in the bending area BA, and sensor pad lines TPL disposed in the second sub-region SB2.

The sensor lines SL may extend to the non-display area NDA and the first sub-region SB1, and may be respectively connected to the sensor connection lines TSCL disposed in the bending area BA.

Further, the sensor connection lines TSCL of the bending area BA may be respectively connected to the sensor pads TP1 and TP2 (see FIG. 7) through the sensor pad lines TPL disposed in the second sub-region SB2.

The sensor pad lines TPL connect the sensor connection lines TSCL of the bending area BA and the sensor pads TP1 and TP2 (see FIG. 7).

As shown in FIG. 17, each of the sensor lines SL and the sensor pad lines TPL may be disposed on the first sensor insulating layer TINS1 similarly to the sensor electrodes TE and RE (see FIG. 10) and may be covered with the second sensor insulating layer TINS2.

Further, the sensor connection lines TSCL may be disposed on any one of the organic layers covered with the first sensor insulating layer TINS1, i.e., any one of the third organic layer 180, the second organic layer 160, and the first organic layer 150. Alternatively, the sensor connection lines TSCL may be disposed on the second interlayer insulating layer 142 that is an inorganic layer disposed directly under the first organic layer 150.

For example, as shown in FIG. 17, the sensor connection lines TSCL may be disposed on the third organic layer 180 to be located on the same layer as the second light emitting electrode 173 (see FIG. 10), and may be covered with the first sensor insulating layer TINS1 and the second sensor insulating layer TINS2.

The sensor lines SL disposed in the first sub-region SB1 on the first sensor insulating layer TINS1 may be respectively electrically connected to one ends of the sensor connection lines TSCL on the third organic layer 180 through a first sensor line contact hole TCH1 penetrating the first sensor insulating layer TINS1.

Further, the sensor pad lines TPL disposed in the second sub-region SB2 on the first sensor insulating layer TINS1 may be respectively electrically connected to the other ends of the sensor connection lines TSCL on the third organic layer 180 through a second sensor line contact hole TCH2 penetrating the first sensor insulating layer TINS1.

As described above, the second sensor insulating layer TINS2 may also be disposed in the second sub-region SB2 to cover the sensor pad line TPL. Therefore, in order to protect the contact holes disposed in the second sub-region SB2 from permeation of moisture or ions generated by the second sensor insulating layer TINS2, the first hole protection layer HPL1 may also be disposed in the second sub-region SB2.

Specifically, as shown in FIG. 12, the display panel 100 according to the first embodiment A1 may further include control pad lines CSPL disposed in the second sub-region SB2 and respectively connected between some of the display pads DP (see FIG. 2) and the control connection lines CSCL.

As shown in FIG. 14, each of the control pad lines CSPL of the second sub-region SB2 may have a jumping structure in which a control pad line upper part CSPL1 on the first interlayer insulating layer 141 and a control pad line lower part CSPL2 on the gate insulating layer 130 are combined. The control pad line upper part CSPL1 may be electrically connected to the control pad line lower part CSPL2 through a second control line jump hole CSPH penetrating the first interlayer insulating layer 141.

However, the illustration of FIG. 14 is merely an example, and each of the control signal lines CSL of the first sub-region SB1, the control connection lines CSCL of the bending area BA, the first control line contact holes CSCT1, the control pad lines CSPL of the second sub-region SB2, and second control line contact holes CSCT2 may be implemented in a different manner from that illustrated in FIG. 14 within a range in which a short circuit defect does not occur.

The control connection lines CSCL of the bending area BA may be respectively connected to the control pad lines CSPL of the second sub-region SB2 through the second control line contact holes CSCT2. Since the control pad lines CSPL are covered with the second sensor insulating layer TINS2, moisture or ions generated by the second sensor insulating layer TINS2 may also flow into the second control line contact holes CSCT2.

Accordingly, in accordance with the first embodiment A1, the first hole protection layer HPL1 may further correspond to the second control line contact holes CSCT2 as well as the first control line contact holes CSCT1. That is, the first hole protection layer HPL1 may cover the first control line contact holes CSCT1 and the second control line contact holes CSCT2.

Due to the first hole protection layer HPL1, the organic layers 150, 160, and 180 around the first control line contact holes CSCT1 and the second control line contact holes CSCT2 may be blocked from moisture or ions flowing into the second sensor insulating layer TINS2. Therefore, a disconnection defect or a poor connection defect between the control signal lines CSL and the control pad lines CSPL may be prevented.

As shown in FIG. 11, the display panel 100 according to the first embodiment A1 may further include the first power line VDL for supplying the first power to the plurality of sub-pixel areas SPX arranged in the display area DA, the second power line VSL for supplying the second power different from the first power to the plurality of sub-pixel areas SPX, and first power connection lines VDCL and second power connection lines VSCL disposed in the bending area BA.

The first power connection lines VDCL of the bending area BA may be connected to the first power line VDL extending to the non-display area NDA and the first sub-region SB1.

Since the first power connection lines VDCL of the bending area BA are disposed on a layer different from the first power line VDL of the first sub-region SB1, the first power connection lines VDCL may be connected to the first power line VDL of the first sub-region SB1 through the first power line contact holes.

The second power connection lines VSCL of the bending area BA may be connected to the second power line VSL extending to the non-display area NDA and the first sub-region SB1.

Since the second power connection lines VSCL of the bending area BA are disposed on a layer different from the second power line VSL of the first sub-region SB1, the second power connection lines VSCL may be connected to the second power line VSL of the first sub-region SB1 through the second power line contact holes.

For example, as shown in FIG. 15, each of the second power lines VSL of the first sub-region SB1 may have a jumping structure in which a second power line upper part VSL1 on the first organic layer 150 and a second power line lower part VSL2 on the gate insulating layer 130 are combined.

As described above, when the second power line VSL has a jumping structure in which the second power line upper part VSL1 and the second power line lower part VSL2 are combined, the lines of the non-display area NDA and the first sub-region SB1 may be implemented with a smaller number of conductive layers compared to the number of the lines while avoiding a short circuit between the lines disposed in the non-display area NDA and the first sub-region SB1.

When the second power line upper part VSL1 is disposed on the first organic layer 150, the second power connection line VSCL of the bending area BA may be disposed on the second organic layer 160 covering the anode connection electrode ANDE1 and the second power line upper part VSL1 to be located on the same layer as the first light emitting electrode 171 (see FIG. 10). Further, in the first sub-region SB1, the second power connection lines VSCL on the second organic layer 160 may be respectively electrically connected to the second power line VSL through the second power line contact holes VSCT1 penetrating the second organic layer 160.

Further, as shown in FIG. 11, the display panel 100 of the first embodiment A1 may further include the first power pad lines VDPL and the second power pad lines VSPL disposed in the second sub-region SB2.

One ends of the first power pad lines VDPL of the second sub-region SB2 may be respectively connected to the first power connection lines VDCL of the bending area BA, and the other ends of the first power pad lines VDPL of the second sub-region SB2 may be connected to some of the display pads DP (see FIG. 2) disposed in the second sub-region SB2 or the display driving circuit 200 (see FIG. 1). That is, the first power pad lines VDPL respectively connect some of the display pads DP or the display driving circuit 200 and the first power connection lines VDCL of the bending area BA.

The first power pad lines VDPL of the second sub-region SB2 may be disposed on the same layer as the first power line VDL of the first sub-region SB1. That is, the first power pad lines VDPL of the second sub-region SB2 are disposed on a layer different from the first power connection lines VDCL of the bending area BA. Accordingly, the first power pad lines VDPL of the second sub-region SB2 may be connected to the first power connection lines VDCL of the bending area BA through third power line contact holes.

The second power pad lines VSPL of the second sub-region SB2 may be disposed on the same layer as the second power line VSL of the first sub-region SB1. That is, the second power pad lines VSPL of the second sub-region SB2 are disposed on a layer different from the second power connection lines VSCL of the bending area BA. Accordingly, the second power pad lines VSPL of the second sub-region SB2 may be connected to the second power connection lines VSCL of the bending area BA through fourth power line contact holes VSCT2 (see FIG. 15).

For example, as shown in FIG. 15, each of the second power pad lines VSPL of the second sub-region SB2 may be a combination of a second power pad line upper part VSPL1 disposed on the first organic layer 150 and a second power pad line lower part VSPL2 disposed on the gate insulating layer 130, similarly to the second power line VSL of the first sub-region SB1.

Further, in the second sub-region SB2, the second power connection lines VSCL on the second organic layer 160 may be respectively electrically connected to the second power pad lines VSPL through the fourth power line contact holes VSCT2 penetrating the second organic layer 160.

However, the illustration of FIG. 15 is merely an example, and each of the second power line VSL of the first sub-region SB1, the second power connection lines VSCL of the bending area BA, the second power line contact holes VSCT1, the second power pad lines VSPL of the second sub-region SB2, and the fourth power line contact holes VSCT2 may be implemented in a different manner from that illustrated in FIG. 15 within a range in which a short circuit defect does not occur.

For another example, although not shown separately, each of the second power line VSL of the first sub-region SB1 and the second power pad line VSPL of the second sub-region SB2 may further include at least one additional lower part (not shown) among the gate insulating layer 130, the first interlayer insulating layer 141, and the second interlayer insulating layer 142.

For still another example, although not shown separately, the second power connection line VSCL of the bending area BA may be disposed on the third organic layer 180 to be located on the same layer as the second light emitting electrode 173 of FIG. 10. In this case, the second power line contact hole VSCT1 and the fourth power line contact hole VSCT2 penetrate the second organic layer 160 and the third organic layer 180.

Meanwhile, the first power line VDL, the first power connection lines VDCL, the first power line contact holes between the first power line VDL and the first power connection line VDCL, the first power pad lines VDPL, and the third power line contact holes between the first power pad lines VDPL and the first power connection lines VDCL are similar to the second power line VSL, the second power connection lines VSCL, the second power line contact holes VSCT1, the second power pad lines VSPL, and the fourth power line contact holes VSCT2 described with reference to FIGS. 11 and 15, so that redundant description thereof will be omitted.

As shown in FIG. 11, the display panel 100 according to the first embodiment A1 may further include data fan-out lines DFL disposed in the non-display area NDA and the first sub-region SB1 and respectively connected to the data lines DL (see FIG. 5) of the display area DA, a data connection line DCL disposed in the bending area BA, and data pad lines DPL disposed in the second sub-region SB2.

The data fan-out lines DFL may be respectively electrically connected to the data lines DL through a pattern connected to each of the data lines DL or a separate hole.

The data connection line DCL of the bending area BA may be disposed on a layer different from the data fan-out lines DFL of the first sub-region SB1 and the data pad lines DPL of the second sub-region SB2.

For example, as shown in FIG. 16, each of the data fan-out lines DFL of the first sub-region SB1 may have a jumping structure in which a data line upper part DFL1 disposed on the first interlayer insulating layer 141 and a data line lower part DFL2 disposed on the gate insulating layer 130 are combined.

Further, each of the data pad lines DPL of the second sub-region SB2 may have a jumping structure in which a data pad line upper part DPL1 disposed on the first interlayer insulating layer 141 and a data pad line lower part DPL2 disposed on the gate insulating layer 130 are combined.

The data connection line DCL may be disposed on any one of the second interlayer insulating layer 142 covering the first interlayer insulating layer 141, the first organic layer 150, the second organic layer 160, and the third organic layer 180.

For example, as shown in FIG. 16, the data connection line DCL may be disposed on the third organic layer 180 to be located on the same layer as the second light emitting electrode 173 (see FIG. 10).

In this case, one end of the data connection line DCL of the bending area BA may be respectively electrically connected to the data fan-out lines DFL of the first sub-region SB1 through first data line contact holes DCT1 penetrating the second interlayer insulating layer 142, the first organic layer 150, the second organic layer 160, and the third organic layer 180. Further, the other end of the data connection line DCL may be respectively electrically connected to the data pad lines DPL of the second sub-region SB2 through second data line contact holes DCT2 penetrating the second interlayer insulating layer 142, the first organic layer 150, the second organic layer 160, and the third organic layer 180.

However, the illustration of FIG. 16 is merely an example, and each of the data fan-out lines DFL of the first sub-region SB1, the data connection line DCL of the bending area BA, the first data line contact holes DCT1, the data pad lines DPL of the second sub-region SB2, and the second data line contact holes DCT2 may be implemented in a different manner from that illustrated in FIG. 16 within a range in which a short circuit defect does not occur.

For another example, although not shown separately, the data line upper part DFL1 of the first sub-region SB1 and the data pad line upper part DPL1 of the second sub-region SB2 may be disposed on any one of the second interlayer insulating layer 142, the first organic layer 150, and the second organic layer 160, rather than the first interlayer insulating layer 141.

For still another example, although not shown separately, each of the data fan-out lines DFL of the first sub-region SB1 and the data pad lines DPL of the second sub-region SB2 may further include an additional upper part (not shown) disposed on any one of the second interlayer insulating layer 142, the first organic layer 150, and the second organic layer 160.

As shown in FIG. 11, the display panel 100 according to the first embodiment A1 may further include constant voltage supply lines CVL disposed in the non-display area NDA and the first sub-region SB1 to supply predetermined constant voltages to the plurality of sub-pixel areas SPX or the scan drivers SDC1 and SDC2, constant voltage supply connection lines CVCL disposed in the bending area BA, and constant voltage supply pad lines CVPL disposed in the second sub-region SB2.

As shown in FIG. 12, the constant voltage supply lines CVL may include the gate initialization voltage line VGIL for supplying the first initialization voltage to the plurality of sub-pixel areas SPX, and the emission initialization voltage line VAIL for supplying the second initialization voltage to the plurality of sub-pixel areas SPX.

Further, as shown in FIG. 12, the constant voltage supply lines CVL may further include a first gate voltage line VGHL for supplying a first gate voltage of a first voltage level to the scan drivers SDC1 and SDC2, and a second gate voltage line VGLL for supplying a second gate voltage of a second voltage level different from the first voltage level to the scan drivers SDC1 and SDC2.

The constant voltage supply lines CVL, the constant voltage supply connection lines CVCL, and the constant voltage pad lines CVPL may be similar to the control signal lines CSL, the control connection lines CSCL, and the control pad lines CSPL described with reference to FIG. 14.

Alternatively, the constant voltage supply lines CVL, the constant voltage supply connection lines CVCL, and the constant voltage pad lines CVPL may be similar to the second power line VSL, the second power connection lines VSCL, and the second power pad lines VSPL described with reference to FIG. 15.

Alternatively, the constant voltage supply lines CVL, the constant voltage supply connection lines CVCL, and the constant voltage pad lines CVPL may be similar to the data fan-out lines DFL, the data connection lines DCL, and the data pad lines DPL described with reference to FIG. 16.

Accordingly, the constant voltage supply lines CVL, the constant voltage supply connection lines CVCL, and the constant voltage pad lines CVPL are similar to the lines described with reference to FIGS. 14, 15, and 16, so that redundant description thereof will be omitted.

As described above, in accordance with the first embodiment A1, the flow of moisture or ions generated by the second sensor insulating layer TINS2 into the first control line contact holes CSCT1 may be prevented by the first hole protection layer HPL1 covering the first control line contact holes CSCT1 for connection between the control signal lines CSL and the control connection lines CSCL. Therefore, it is possible to prevent the organic layers 150, 160, and 180 around the first control line contact holes CSCT1 from being deformed in response to moisture or ions generated by the second sensor insulating layer TINS2. Accordingly, it is possible to prevent a disconnection defect or a poor connection defect of the control signal lines CSL and the control connection lines CSCL made of a metal material.

Further, in accordance with the first embodiment A1, the first hole protection layer HPL1 may further cover the second control line contact holes CSCT2 for connection between the control pad lines CSPL and the control connection lines CSCL. Accordingly, a disconnection defect or a poor connection defect of the control pad lines CSPL may be prevented.

Figure 18:
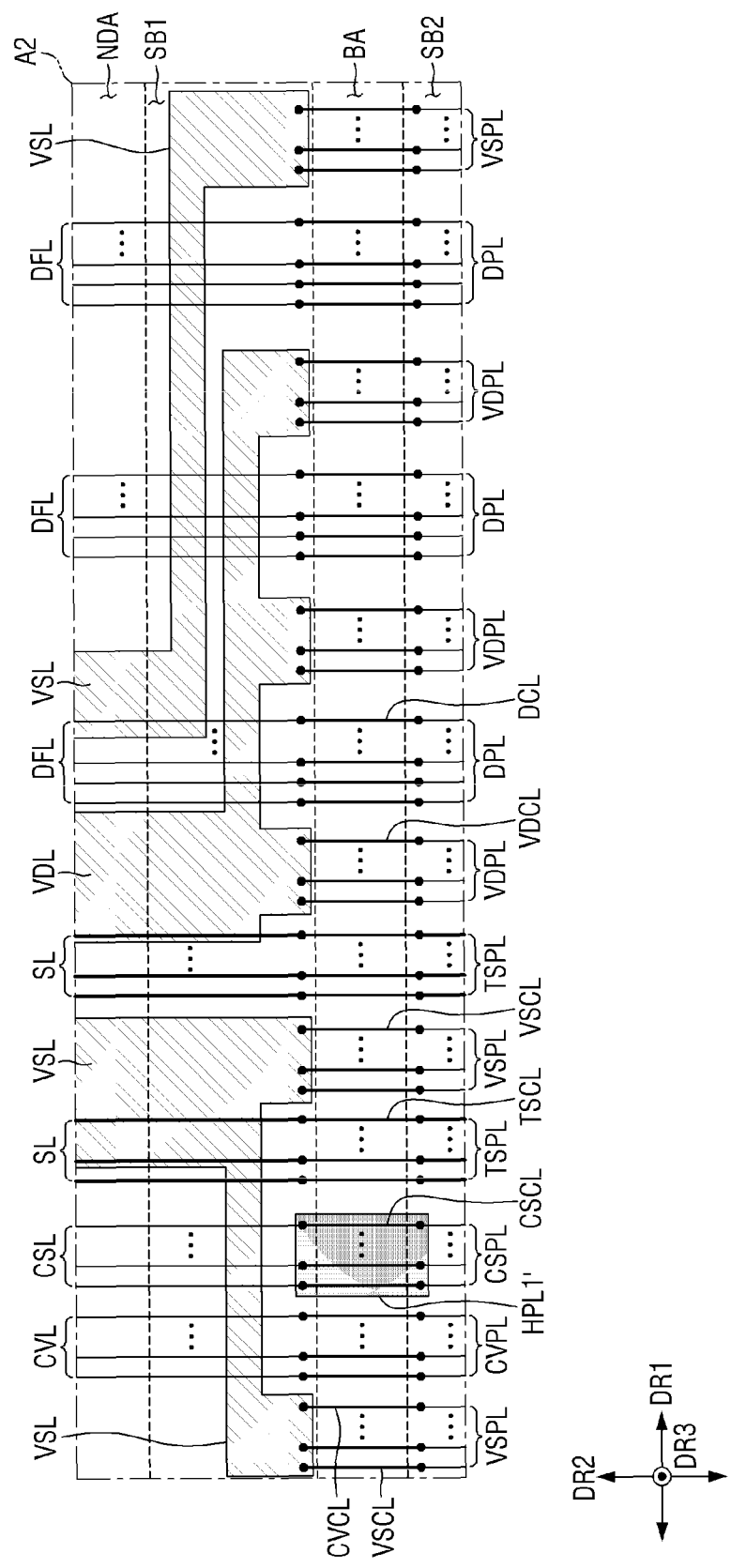
FIG. 18 is a layout diagram showing area A of FIG. 2 according to a second embodiment.
Figure 19:
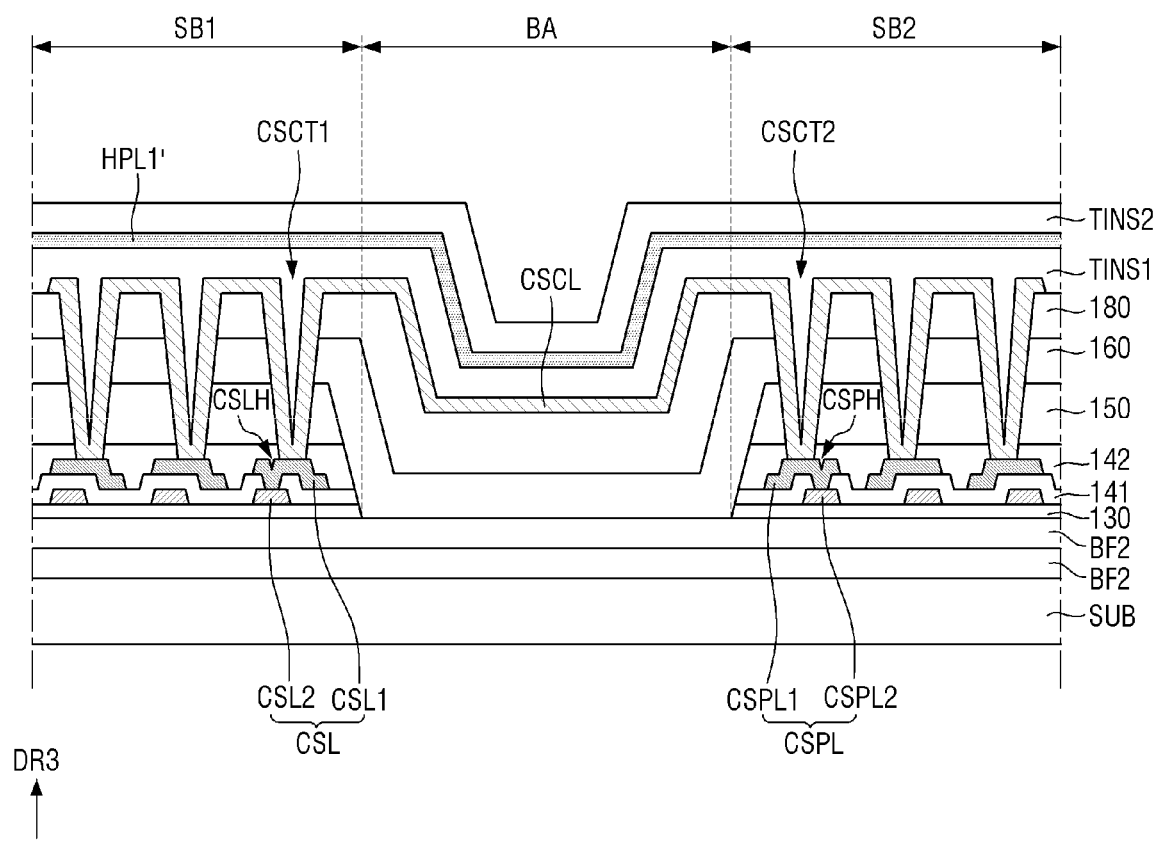
FIG. 19 is a cross-sectional view showing an example of the control signal line, the control signal connection line, and the control signal pad line of FIG. 18.

FIG. 18 is a layout diagram showing area A of FIG. 2 according to a second embodiment. FIG. 19 is a cross-sectional view showing an example of the control signal line, the control signal connection line, and the control signal pad line of FIG. 18.

Referring to FIGS. 18 and 19, in the display panel 100 according to a second embodiment A2, a first hole protection layer HPL1' corresponds to the first control line contact holes CSCT1 and the second control line contact holes CSCT2, and completely overlaps the control connection lines CSCL of the bending area BA. Since the second embodiment A2 of FIGS. 18 and 19 is the same as the first embodiment A1 described with reference to FIGS. 11 to 17 except that, redundant description thereof will be omitted.

As shown in FIG. 19, in accordance with the second embodiment A2, the first hole protection layer HPL1' is disposed between the control connection lines CSCL of the bending area BA and the second sensor insulating layer TINS2.

Accordingly, the flow of moisture or ions generated by the second sensor insulating layer TINS2 into the control connection lines CSCL may be prevented, so that it is possible to prevent a disconnection defect or a poor connection defect of the control connection lines CSCL.

Figure 20:
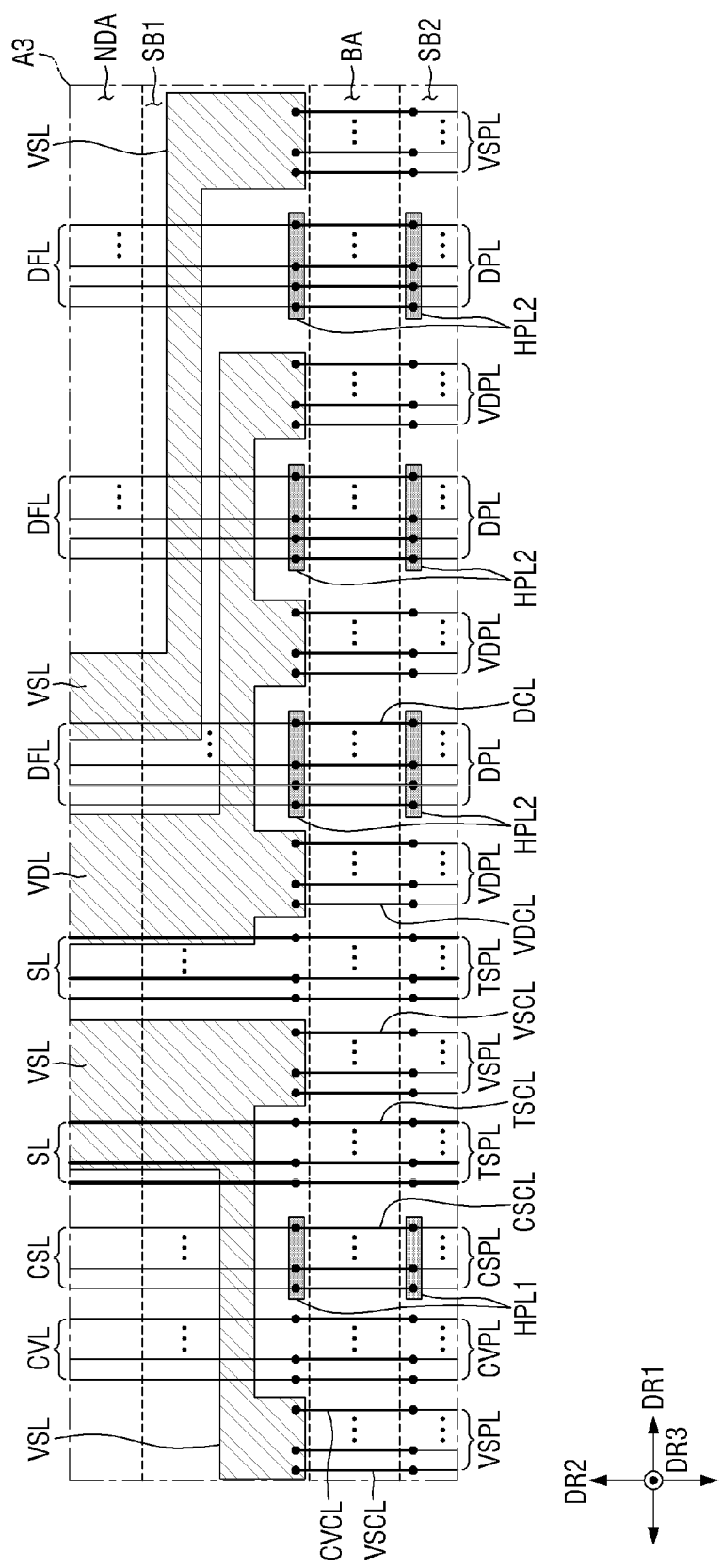
FIG. 20 is a layout diagram showing area A of FIG. 2 according to a third embodiment.
Figure 21:
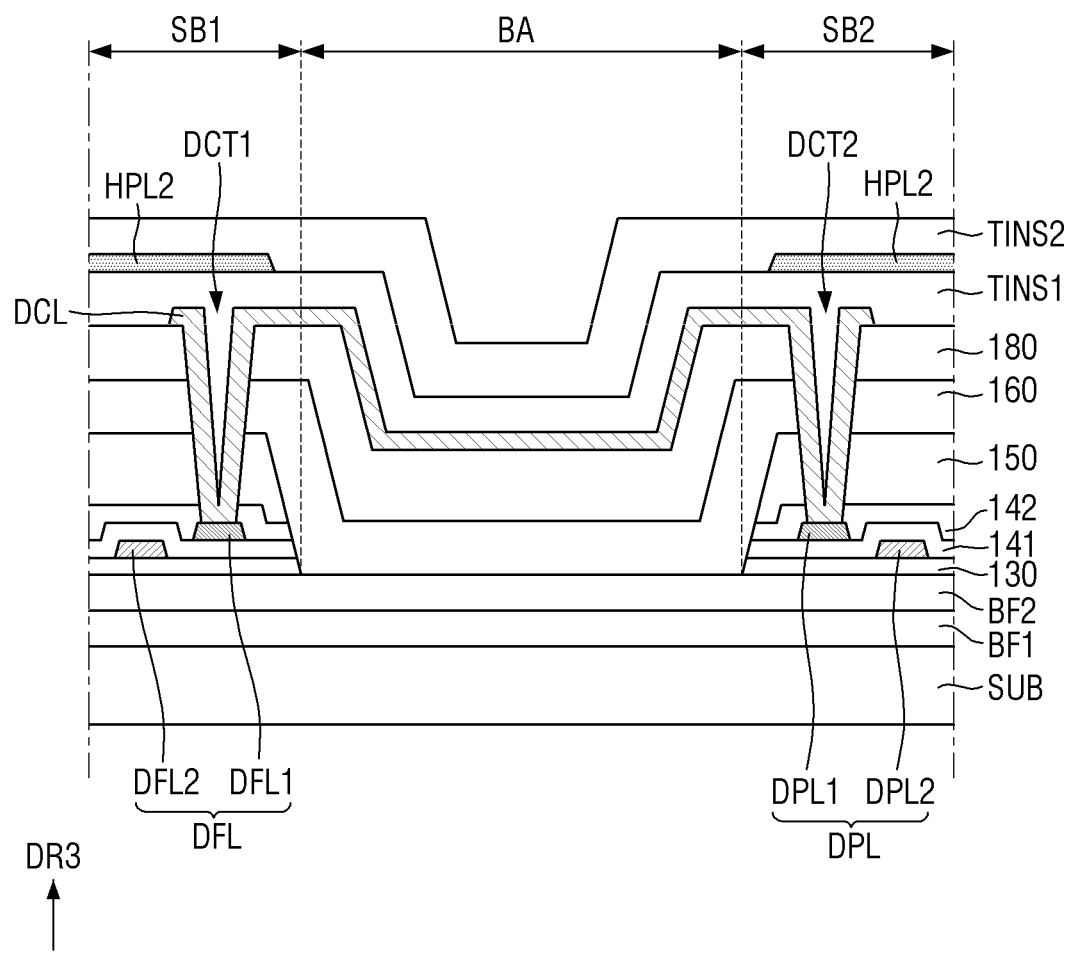
FIG. 21 is a cross-sectional view showing an example of the data fan-out line, the data connection line, and the data pad line of FIG. 20.

FIG. 20 is a layout diagram showing area A of FIG. 2 according to a third embodiment. FIG. 21 is a cross-sectional view showing an example of the data fan-out line, the data connection line, and the data pad line of FIG. 20.

Referring to FIGS. 20 and 21, the display panel 100 according to a third embodiment A3 further includes a second hole protection layer HPL2 disposed between the data connection lines DCL and the second sensor insulating layer TINS2 and corresponding to the first data line contact hole DCT1 (see FIG. 16) and the second data line contact hole DCT2 (see FIG. 16). Since the third embodiment A3 of FIGS. 20 and 21 is the same as the first embodiment A1 described with reference to FIGS. 11 to 17 except that, redundant description thereof will be omitted.

As shown in FIG. 21, in accordance with the third embodiment A3, the second hole protection layer HPL2 disposed between the second sensor insulating layer TINS2 and the data connection lines DCL overlaps the first data line contact holes DCT1 connecting the data fan-out lines DFL of the first sub-region SB1 and the data connection lines DCL of the bending area BA.

Accordingly, moisture or ions generated by the second sensor insulating layer TINS2 may be blocked by the second hole protection layer HPL2 and prevented from flowing into the first data line contact holes DCT1, so that it is possible to prevent the deformation of the organic layers 150, 160, and 180 around the first data line contact holes DCT1. Accordingly, it is possible to prevent a disconnection defect or a poor connection defect of one ends of the data fan-out lines DFL corresponding to the first data line contact holes DCT1 and one ends of the data connection lines DCL.

Further, the second hole protection layer HPL2 disposed between the second sensor insulating layer TINS2 and the data connection lines DCL may further overlap the second data line contact holes DCT2 respectively connecting the data pad lines DPL of the second sub-region SB2 and the data connection lines DCL of the bending area BA.

Accordingly, moisture or ions generated by the second sensor insulating layer TINS2 may be blocked by the second hole protection layer HPL2 and prevented from flowing into the second data line contact holes DCT2, so that it is possible to prevent the deformation of the organic layers 150, 160, and 180 around the second data line contact holes DCT2. Accordingly, it is possible to prevent a disconnection defect or a poor connection defect of one ends of the data pad lines DPL corresponding to the second data line contact holes DCT2 and the other ends of the data connection lines DCL.

Figure 22:
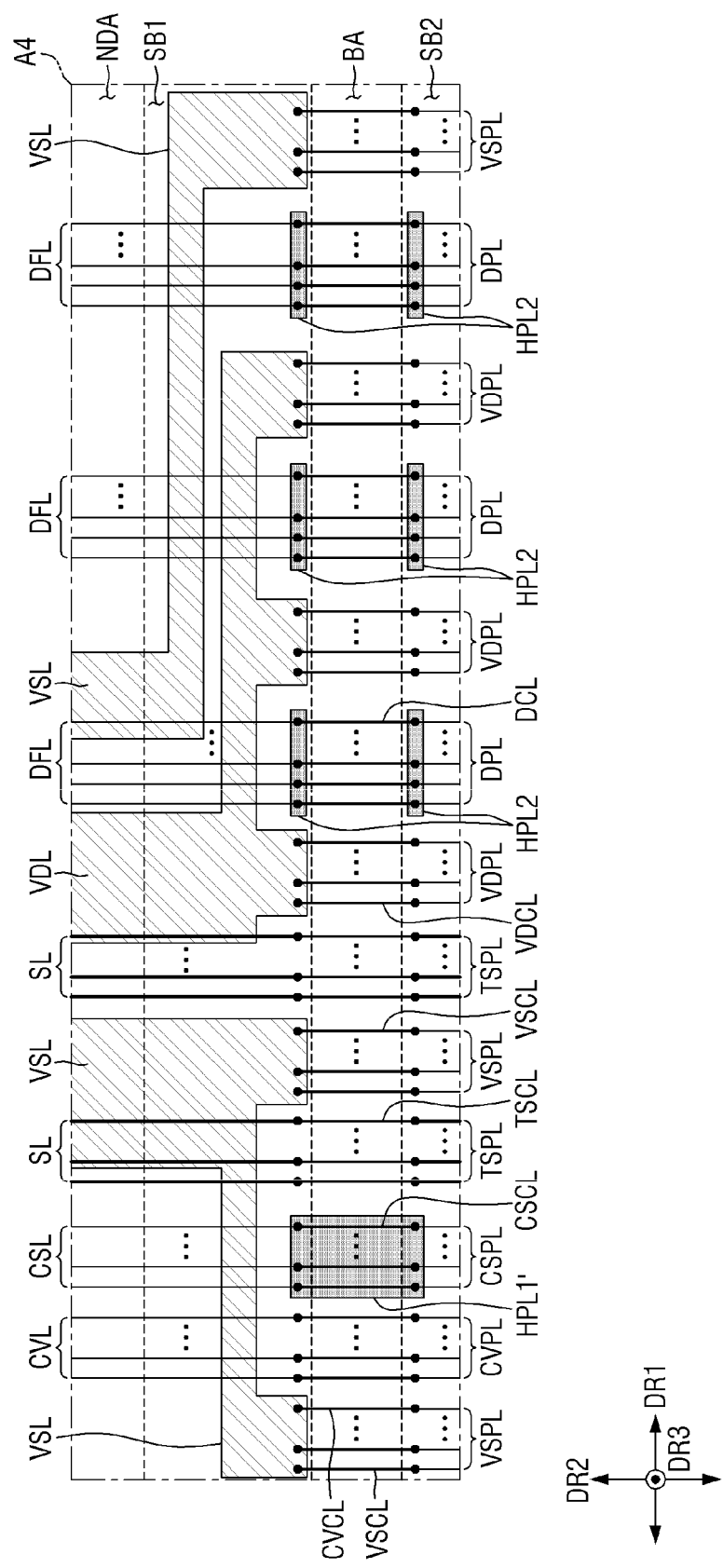
FIG. 22 is a layout diagram showing area A of FIG. 2 according to a fourth embodiment.

FIG. 22 is a layout diagram showing area A of FIG. 2 according to a fourth embodiment.

Referring to FIG. 22, the display panel 100 according to a fourth embodiment A4 is the same as the third embodiment A3 of FIGS. 20 and 21 except that the second embodiment A2 of FIGS. 18 and 19 is reflected, so that redundant description thereof will be omitted.

That is, the display panel 100 according to the fourth embodiment A4 includes the first hole protection layer HPL1' disposed between the control connection lines CSCL of the bending area BA and the second sensor insulating layer TINS2, and the second hole protection layer HPL2 corresponding to the first data line contact hole DCT1 (see FIG. 16) and the second data line contact hole DCT2 (see FIG. 16).

Accordingly, a disconnection defect or a poor connection defect of the control connection line CSCL, the data fan-out line DFL, and the data pad line DPL may be prevented.

Figure 23:
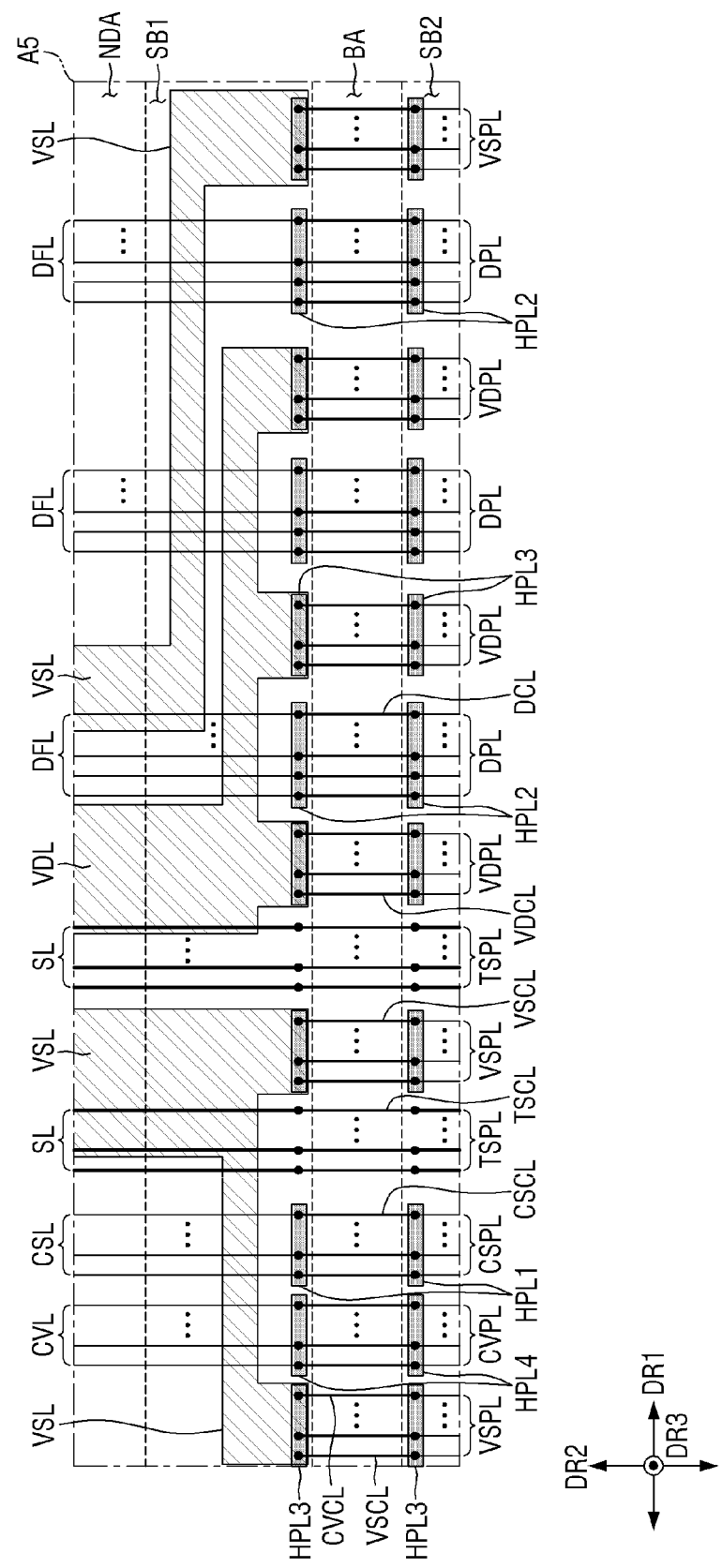
FIG. 23 is a layout diagram showing area A of FIG. 2 according to a fifth embodiment.
Figure 24:
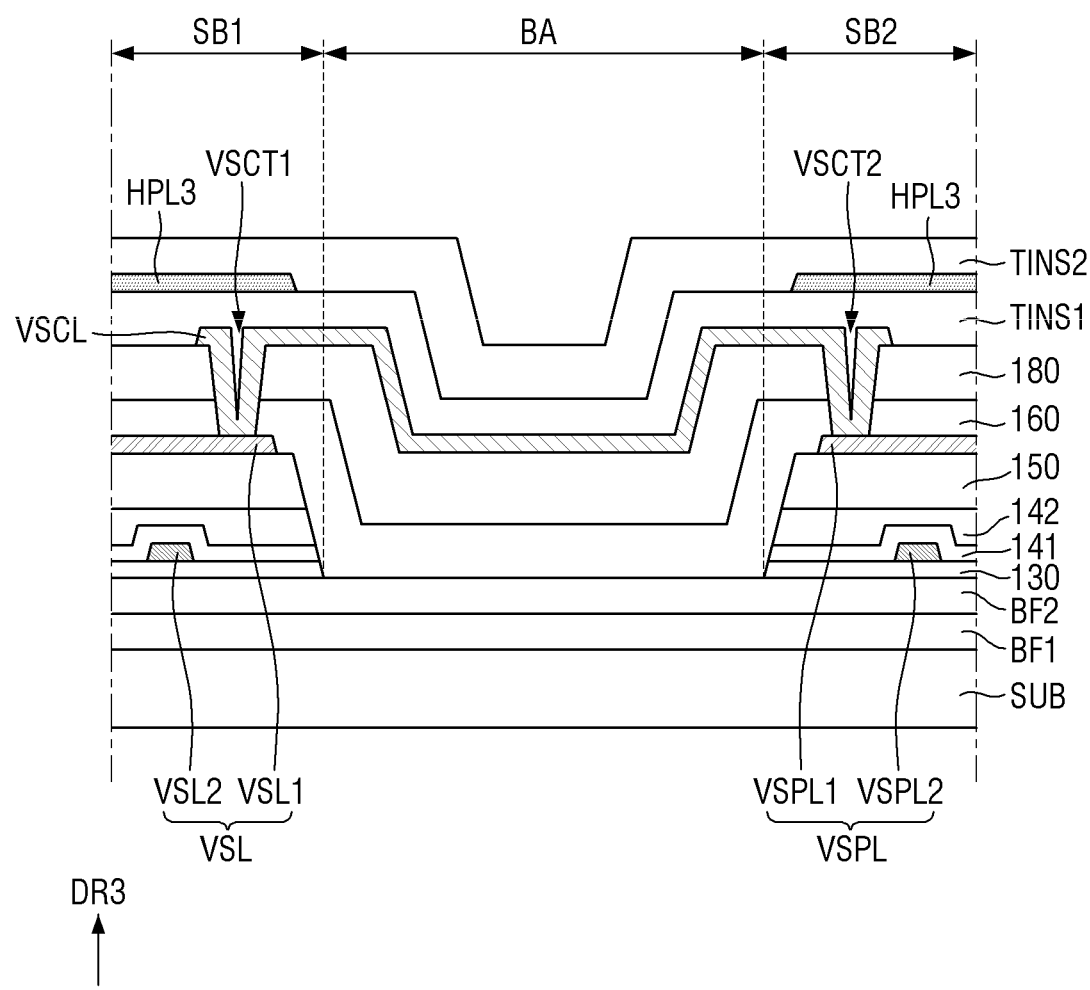
FIG. 24 is a cross-sectional view showing an example of the first power line, the first power connection line, and the first power pad line of FIG. 23.

FIG. 23 is a layout diagram showing area A of FIG. 2 according to a fifth embodiment. FIG. 24 is a cross-sectional view showing an example of the first power line, the first power connection line, and the first power pad line of FIG. 23.

Referring to FIGS. 23 and 24, the display panel 100 according to a fifth embodiment A5 further includes a third hole protection layer HPL3 disposed between the second power connection line VSCL and the second sensor insulating layer TINS2 and corresponding to the second power line contact holes VSCT1 and the fourth power line contact holes VSCT32. Since the fifth embodiment A5 of FIGS. 23 and 24 is the same as the third embodiment A3 of FIGS. 20 and 21 except that, redundant description thereof will be omitted.

As shown in FIG. 24, in accordance with the fifth embodiment A5, the third hole protection layer HPL3 disposed between the second power connection line VSCL and the second sensor insulating layer TINS2 may overlap the second power line contact holes VSCT1 connecting the second power line VSL of the first sub-region SB1 and the second power connecting lines VSCL.

Accordingly, moisture or ions generated by the second sensor insulating layer TINS2 may be blocked by the third hole protection layer HPL3 and prevented from flowing into the second power line contact holes VSCT1, so that ii is possible to prevent the deformation of the organic layers 150, 160, and 180 around the second power line contact holes VSCT1. Accordingly, it is possible to prevent a disconnection defect or a poor connection defect of one ends of the second power lines VSL corresponding to the second power line contact holes VSCT1 and one ends of the second power connection lines VSCL.

Further, in accordance with the fifth embodiment A5, the third hole protection layer HPL3 disposed between the second power connection line VSCL and the second sensor insulating layer TINS2 may further overlap the fourth power line contact holes VSCT2 connecting the second power pad line VSPL of the second sub-region SB2 and the second power connection lines VSCL.

Accordingly, moisture or ions generated by the second sensor insulating layer TINS2 may be blocked by the third hole protective layer HPL3 and prevented from flowing into the fourth power line contact holes VSCT2, so that it is possible to prevent the deformation of the organic layers 150, 160, and 180 around the fourth power line contact holes VSCT2. Accordingly, it is possible to prevent a disconnection defect or a poor connection defect of one ends of the second power pad lines VSPL corresponding to the fourth power line contact holes VSCT2 and the other ends of the second power connection lines VSCL.

Further, as shown in FIG. 23, the third hole protection layer HPL3 may further overlap the first power line contact holes connecting the first power lines VDL of the first sub-region SB1 and the first power connection lines VDCL.

Further, the third hole protection layer HPL3 may further overlap the third power line contact holes connecting the first power pad line VDPL of the second sub-region SB2 and the first power connection lines VDCL.

Accordingly, moisture or ions generated by the second sensor insulating layer TINS2 may be blocked by the third hole protection layer HPL3 and prevented from flowing into the first power line contact holes corresponding to the first power connection line VDCL and the third power line contact holes. Therefore, it is possible to prevent the deformation of the organic layers 150, 160, and 180 around the first power line contact holes and the third power line contact holes. Accordingly, it is possible to prevent a disconnection defect or a poor connection defect of one end of the first power line VDL corresponding to the first power line contact holes and the third power line contact holes, both ends of the first power connection line VDCL, and one end of the first power pad line VDPL.

In addition, as shown in FIG. 23, the display panel 100 according to the fifth embodiment A5 may further include a fourth hole protection layer HPL4 overlapping the contact holes connecting the constant voltage supply lines CVL of the first sub-region SB1 and the constant voltage supply connection lines CVCL.

Further, the fourth hole protection layer HPL4 may further overlap the contact holes connecting the constant voltage pad lines CVPL of the second sub-region and the constant voltage supply connection lines CVCL.

Accordingly, the organic layers 150, 160, and 180 may be prevented from being deformed around the contact holes between the constant voltage supply lines CVL and the constant voltage supply connection lines CVCL and the contact holes between the constant voltage pad lines CVPL and the constant voltage supply connection lines CVCL. Accordingly, it is possible to prevent a disconnection defect or a poor connection defect of the constant voltage supply lines CVL, the constant voltage supply connection lines CVCL, and the constant voltage pad lines CVPL.

Although embodiments of the present inventive concepts have been described, various modifications and similar arrangements of such embodiments will be apparent to a person of ordinary skill in the art. Accordingly, the inventive concepts are not limited to such embodiments, but rather to the scope and spirit of the appended claims.

What is claimed is:

1. A display device comprising:
a substrate comprising a main region and a sub-region, the main region comprising a display area and a non-display area, the display area in which a plurality of sub-pixel areas configured to emit light for displaying an image are arranged, the non-display area disposed around the display area, and the sub-region protruding from one side of the main region and comprising a bending area which is deformed to be bent;
a thin film transistor layer disposed in the display area on the substrate;
a scan driver configured to output a scan signal to scan lines of the thin film transistor layer;
a light emitting element layer disposed on the thin film transistor layer;
a sensor electrode layer comprising a first sensor insulating layer and a second sensor insulating layer, the first sensor insulating layer disposed on an encapsulation layer which covers the light emitting element layer and the second sensor insulating layer covering sensor electrodes on the first sensor insulating layer;
control signal lines electrically connected to the scan driver and disposed in the non-display area and a first sub-region of the sub-region which is connected to the non-display area;
control connection lines disposed in the bending area and electrically connected to the control signal lines through first control line contact holes, respectively; and
a first hole protection layer disposed between the second sensor insulating layer and the control connection lines and corresponding to the first control line contact holes.

2. The display device of claim 1, further comprising:
display pads and sensor pads electrically connected to a circuit board and disposed in a second sub-region of the sub-region which is connected to the bending area; and
control pad lines disposed in the second sub-region and the control pad lines electrically connected between some of the display pads and the control connection lines, respectively,
wherein the control connection lines are respectively connected to the control pad lines through second control line contact holes, and
the first hole protection layer further corresponds to the second control line contact holes.

3. The display device of claim 2, wherein the first hole protection layer is formed on the same layer as the sensor electrodes.

4. The display device of claim 2, wherein the first hole protection layer completely overlaps the control connection lines.

5. The display device of claim 2, further comprising:
data fan-out lines disposed in the non-display area and the first sub-region and the data fan-out lines electrically connected to data lines of the thin film transistor layer, respectively;
data connection lines disposed in the bending area and data connection lines electrically connected to the data fan-out lines through first data line contact holes, respectively; and
a second hole protection layer disposed between the second sensor insulating layer and the data connection lines and corresponding to the first data line contact holes.

6. The display device of claim 5, further comprising:
a display driving circuit mounted in the second sub-region and configured to output a data signal of each of the plurality of sub-pixel areas; and
data pad lines disposed in the second sub-region and data pad lines electrically connected between the display driving circuit and the data connection lines, respectively,
wherein the data connection lines are electrically connected to the data pad lines through second data line contact holes, respectively, and
the second hole protection layer further corresponds to the second data line contact holes.

7. The display device of claim 6, wherein the first hole protection layer and the second hole protection layer are formed on the same layer as the sensor electrodes.

8. The display device of claim 6, wherein the first hole protection layer completely overlaps the control connection lines.

9. The display device of claim 6, further comprising:
a first power line configured to supply a first power to the plurality of sub-pixel areas;
a second power line configured to supply a second power different from the first power to the plurality of sub-pixel areas;
first power connection lines disposed in the bending area and connected to the first power line extending to the non-display area and the first sub-region; and
second power connection lines disposed in the bending area and connected to the second power line extending to the non-display area and the first sub-region,
wherein the first power connection lines are connected to the first power line through first power line contact holes, and the second power connection lines are connected to the second power line through second power line contact holes.

10. The display device of claim 9, further comprising a third hole protection layer disposed between the second sensor insulating layer and the first power connection lines and corresponding to the second power line contact holes.

11. The display device of claim 10, further comprising:
first power pad lines disposed in the second sub-region and first power pad lines electrically connected to the first power connection lines through third power line contact holes, respectively; and
second power pad lines disposed in the second sub-region and second power pad lines electrically connected to the second power connection lines through fourth power line contact holes, respectively.

12. The display device of claim 11, wherein the third hole protection layer further corresponds to the fourth power line contact holes.

13. The display device of claim 12, wherein the third hole protection layer further corresponds to the first power line contact holes and the third power line contact holes.

14. The display device of claim 9, wherein the thin film transistor layer comprises a pixel driving unit corresponding to each of the plurality of sub-pixel areas,
the light emitting element layer comprises a light emitting element corresponding to each of the plurality of sub-pixel areas,
the pixel driving unit of each of the plurality of sub-pixel areas comprises:
a driving transistor disposed in series with the light emitting element between the first power line and the second power line;
a first transistor turned on by the scan signal of the scan line and disposed between a gate electrode of the driving transistor and a second electrode of the driving transistor;
a second transistor turned on by the scan signal of the scan line and disposed between the data line and the first electrode of the driving transistor;
a third transistor disposed between a gate initialization voltage line supplying a first initialization voltage and the gate electrode of the driving transistor;
a fourth transistor disposed between an emission initialization voltage line supplying a second initialization voltage and a first light emitting electrode of the light emitting element;
a fifth transistor disposed between the first power line and the first electrode of the driving transistor; and
a sixth transistor disposed between the second electrode of the driving transistor and the first light emitting electrode of the light emitting element,
wherein the fifth transistor and the sixth transistor are turned on by an emission gate signal of an emission control line.

15. The display device of claim 14, wherein the control signal lines comprise:
at least one scan output control line configured to respectively supply at least one scan timing control signal corresponding to an output timing of the scan signal; and
two or more scan clock lines configured to supply two or more scan clock signals corresponding to generation of the scan signal, respectively.

16. The display device of claim 15, wherein the scan driver further outputs the emission gate signal to the emission control line,
the control signal lines further comprise:
an emission output control line configured to supply at least one emission timing control signal corresponding to an output timing of the emission gate signal; and
two or more emission clock lines configured to supply two or more emission clock signals corresponding to generation of the emission gate signal, respectively.

17. The display device of claim 14, further comprising:
constant voltage supply lines disposed in the non-display area and the first sub-region and the constant voltage supply lines configured to supply predetermined constant voltages to the plurality of sub-pixel areas or the scan driver, respectively;
constant voltage supply connection lines disposed in the bending area and the constant voltage supply connection lines electrically connected to the constant voltage supply lines, respectively; and
constant voltage supply pad lines disposed in the second sub-region and the constant voltage supply pad lines electrically connected to the constant voltage supply connection lines, respectively,
wherein the third hole protection layer further corresponds to contact holes between the constant voltage supply lines and the constant voltage supply connection lines, and contact holes between the constant voltage supply connection lines and the constant voltage supply pad lines.

18. The display device of claim 17, wherein the constant voltage supply lines comprise the gate initialization voltage line and the emission initialization voltage line.

19. The display device of claim 17, wherein the constant voltage supply lines comprise:
a first gate voltage line configured to supply a first gate voltage of a first voltage level to the scan driver; and
a second gate voltage line configured to supply a second gate voltage having a second voltage level different from the first voltage level to the scan driver.

20. The display device of claim 2, wherein the sensor electrodes of the sensor electrode layer are disposed in a touch sensor area corresponding to at least the display area,
the sensor electrode layer further comprises sensor lines disposed in a touch peripheral area that is a periphery of the touch sensor area and the sensor lines electrically connected to some of the sensor electrodes, respectively, the some of the sensor electrodes which are connected side by side in one direction,
the sensor lines extend to the first sub-region and the sensor lines are electrically connected to sensor connection lines disposed in the bending area, respectively,
the sensor connection lines are electrically connected to the sensor pads through sensor pad lines disposed in the second sub-region, respectively, and
the first hole protection layer is formed on the same layer as the sensor lines and the sensor pad lines, and is spaced apart from the sensor lines and the sensor pad lines.

21. The display device of claim 2, wherein the second sensor insulating layer is made of a negative photoresist material.

* * * * *